(12) United States Patent
Yamamoto et al.

(10) Patent No.: US 9,269,822 B2
(45) Date of Patent: Feb. 23, 2016

(54) SEMICONDUCTOR DEVICE AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Yoshitaka Yamamoto, Yamatokoriyama (JP); Tetsuhiro Tanaka, Atsugi (JP); Takayuki Inoue, Sagamihara (JP); Hideomi Suzawa, Atsugi (JP); Yasuhiko Takemura, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/479,623

(22) Filed: Sep. 8, 2014

(65) Prior Publication Data

US 2015/0069387 A1    Mar. 12, 2015

(30) Foreign Application Priority Data

Sep. 12, 2013    (JP) .................................. 2013-189225

(51) Int. Cl.
 *H01L 29/78* (2006.01)
 *H01L 29/786* (2006.01)
 (Continued)

(52) U.S. Cl.
 CPC ............ *H01L 29/7869* (2013.01); *G11C 16/00* (2013.01); *H01L 29/4908* (2013.01);
 (Continued)

(58) Field of Classification Search
 CPC .................... H01L 29/7869; H01L 29/78606; H01L 29/66969
 See application file for complete search history.

(56) References Cited

U.S. PATENT DOCUMENTS

| 3,660,819 A | 5/1972 | Frohman-Bentchkowsky |
| 3,728,695 A | 4/1973 | Frohman-Bentchkowsky |

(Continued)

FOREIGN PATENT DOCUMENTS

| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

(Continued)

*Primary Examiner* — Roy Potter
*Assistant Examiner* — Paul Patton
(74) *Attorney, Agent, or Firm* — Eric J. Robinson; Robinson Intellectual Property Law Office, P.C.

(57) ABSTRACT

A method for manufacturing a semiconductor device with adjusted threshold is provided. In a semiconductor device including a semiconductor, a source or drain electrode electrically connected to the semiconductor, a first gate electrode and a second gate electrode between which the semiconductor is provided, a charge trap layer provided between the first gate electrode and the semiconductor, and a gate insulating layer provided between the second gate electrode and the semiconductor, a threshold is increased by trapping electrons in the charge trap layer by keeping a potential of the first gate electrode at a potential higher than a potential of the source or drain electrode for 1 second or more while heating. After the threshold adjustment process, the first gate electrode is removed or insulated from other circuits. Alternatively, a resistor may be provided between the first gate electrode and other circuits.

24 Claims, 19 Drawing Sheets

(51) Int. Cl.
  *H01L 29/66* (2006.01)
  *G11C 16/00* (2006.01)
  *H01L 29/788* (2006.01)
  *H01L 29/49* (2006.01)

(52) U.S. Cl.
  CPC ...... *H01L29/66969* (2013.01); *H01L 29/7881* (2013.01); *H01L 29/78606* (2013.01); *H01L 29/78648* (2013.01); *H01L 29/78696* (2013.01)

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,005,270 | A * | 12/1999 | Noguchi ................. 257/315 |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,692,223 | B2 | 4/2010 | Isobe et al. |
| 7,732,819 | B2 | 6/2010 | Akimoto et al. |
| 7,791,072 | B2 | 9/2010 | Kumomi et al. |
| 7,851,296 | B2 | 12/2010 | Noda et al. |
| 8,384,080 | B2 | 2/2013 | Taniguchi et al. |
| 8,432,730 | B2 | 4/2013 | Uochi et al. |
| 8,441,009 | B2 | 5/2013 | Ieda |
| 8,486,774 | B2 | 7/2013 | Terai et al. |
| 8,547,771 | B2 | 10/2013 | Koyama |
| 8,575,678 | B2 | 11/2013 | Takemura |
| 8,593,857 | B2 | 11/2013 | Takemura |
| 8,630,127 | B2 | 1/2014 | Uochi et al. |
| 8,692,252 | B2 | 4/2014 | Takata et al. |
| 8,803,142 | B2 | 8/2014 | Yamazaki et al. |
| 8,964,450 | B2 | 2/2015 | Ishizu |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0057745 | A1 | 3/2009 | Yin et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0148171 | A1 | 6/2010 | Hayashi et al. |
| 2011/0240991 | A1 | 10/2011 | Yamazaki |
| 2011/0309876 | A1 | 12/2011 | Terai et al. |
| 2012/0056175 | A1 | 3/2012 | Takemura |
| 2014/0231799 | A1 | 8/2014 | Matsubayashi |
| 2015/0008428 | A1 | 1/2015 | Yamamoto et al. |
| 2015/0011046 | A1 | 1/2015 | Tanaka et al. |
| 2015/0011048 | A1 | 1/2015 | Tanaka et al. |
| 2015/0024577 | A1 | 1/2015 | Kato et al. |
| 2015/0054548 | A1 | 2/2015 | Kato et al. |
| 2015/0060846 | A1 | 3/2015 | Yamamoto et al. |
| 2015/0069385 | A1 | 3/2015 | Yamamoto et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |

(56) References Cited

FOREIGN PATENT DOCUMENTS

| JP | 2003-086808 A | 3/2003 |
|---|---|---|
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2011-124360 | 6/2011 |
| JP | 2011-138934 | 7/2011 |
| JP | 2012-074692 | 4/2012 |
| JP | 2012-257187 | 12/2012 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao. T et al., "Novel Top-Gate Zinc Oxide Thin-Film Transistors (ZnO TFTs) for AMLCDS", J. Soc. Inf. Display (Journal of the Society for Information Display), vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H at al., "21.3:4.0 In. QVGA AMOLED Display Using In—Ga—Zn—Oxide TFTs With a Novel Passivation Layer", SID Digest '09 : SID International Sympolsium Digest of Technical Papers, May 31, 2009, pp. 284-287.

Godo.H et al.; "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

(56) References Cited

OTHER PUBLICATIONS

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—GA—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3In—Ga—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

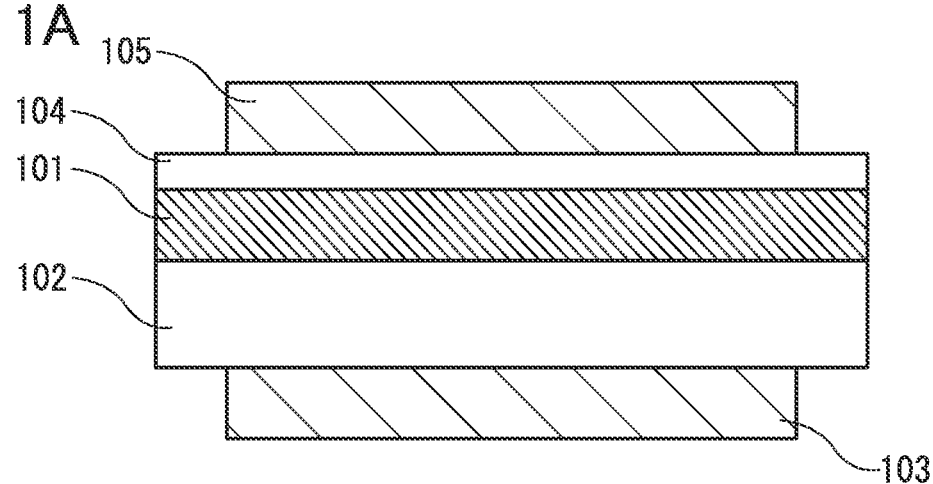
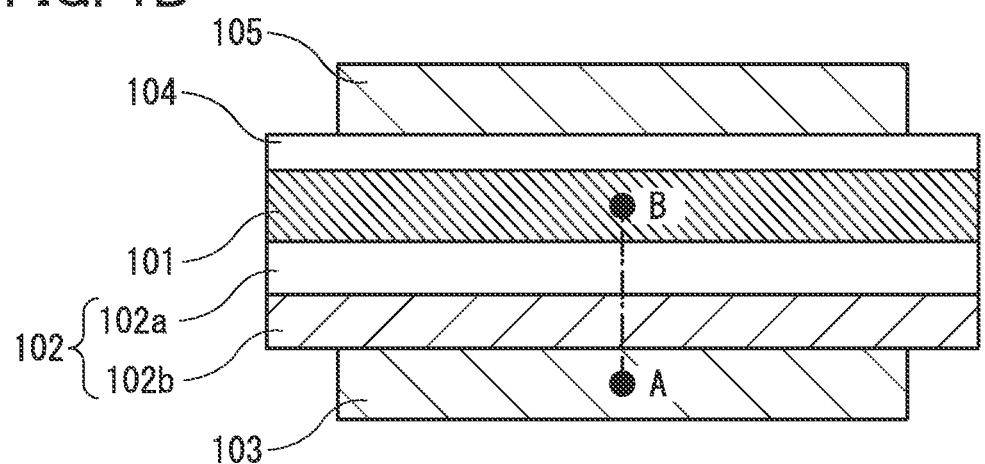
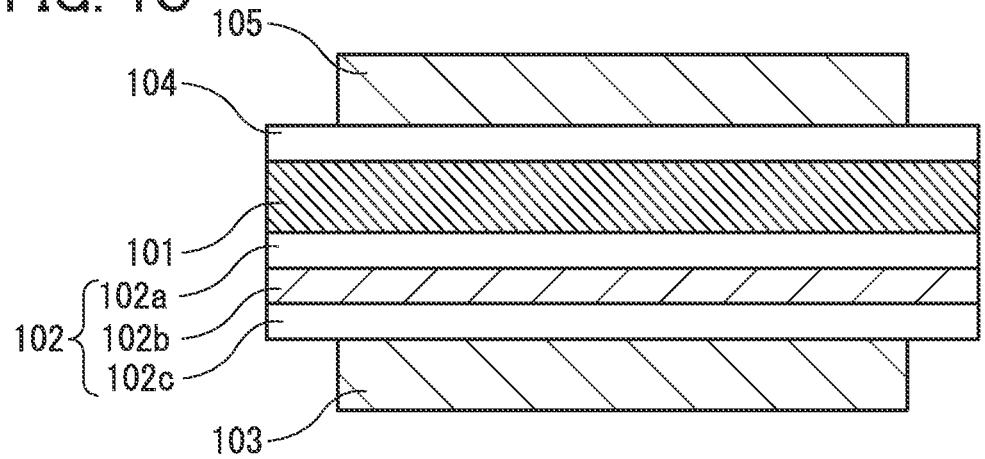

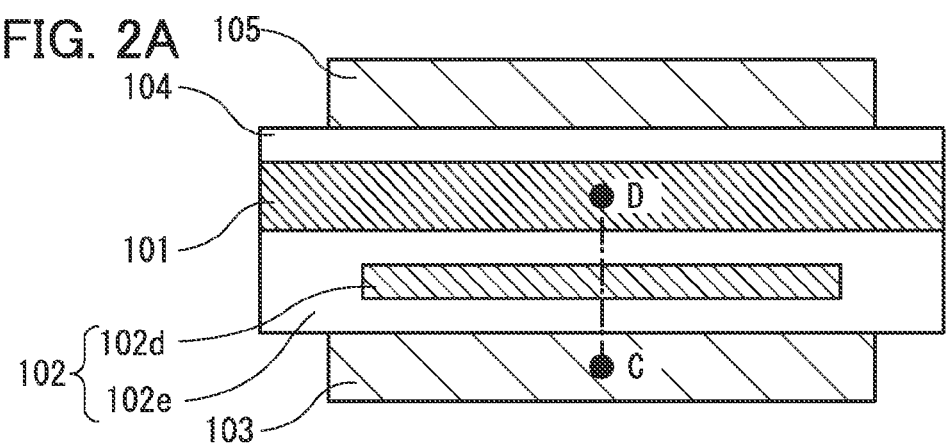
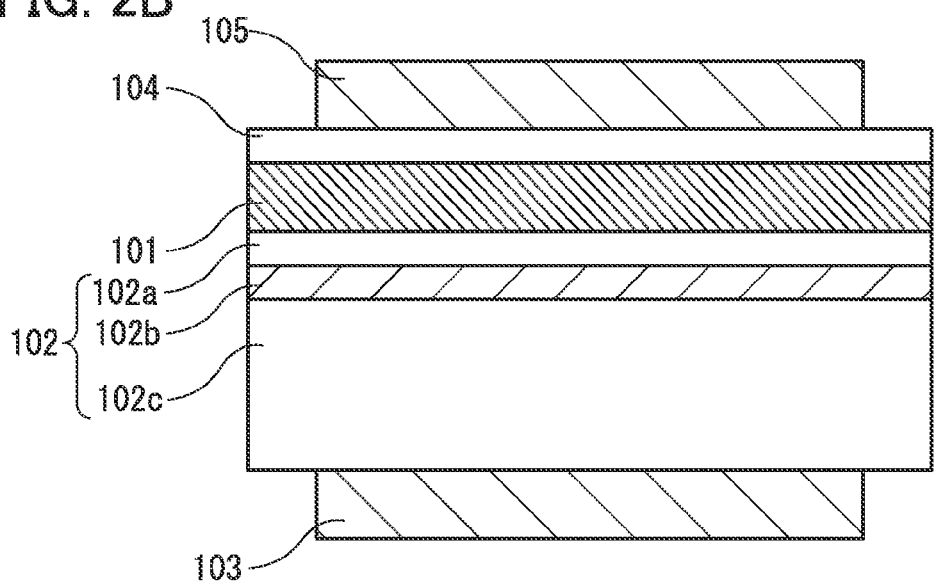
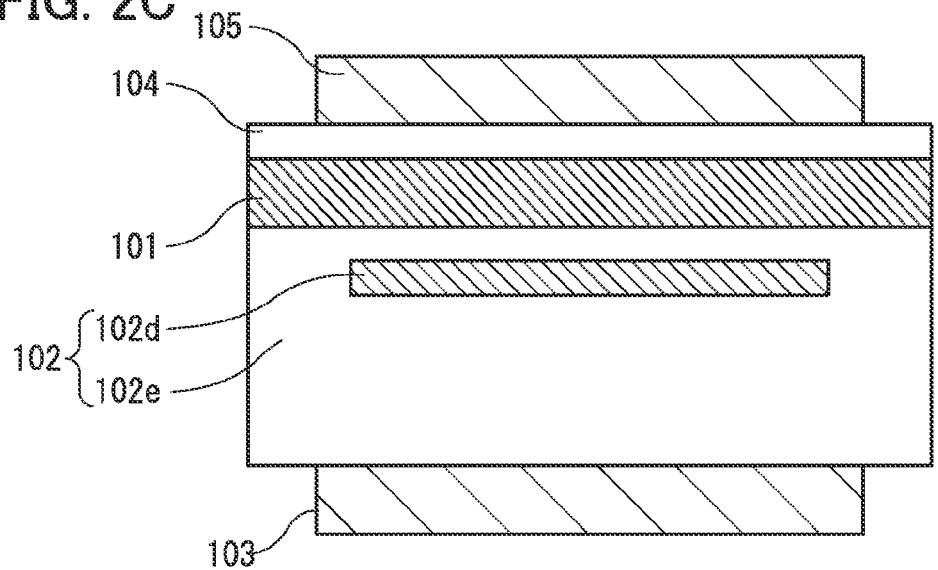

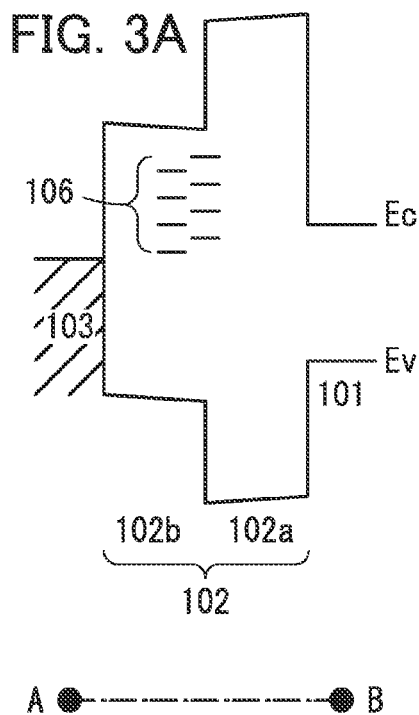
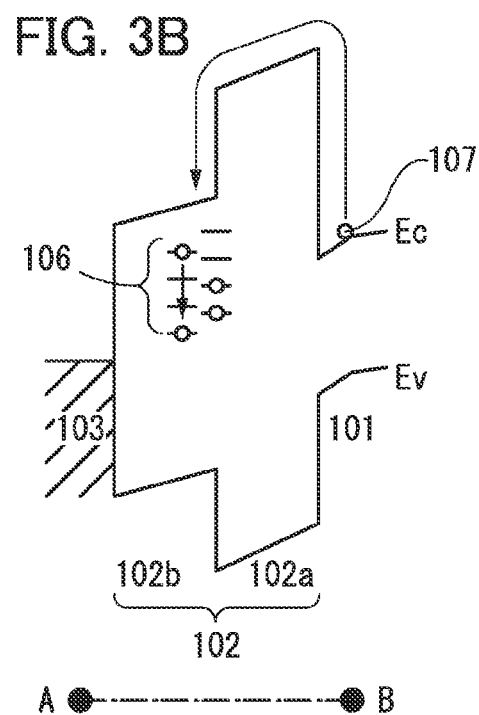
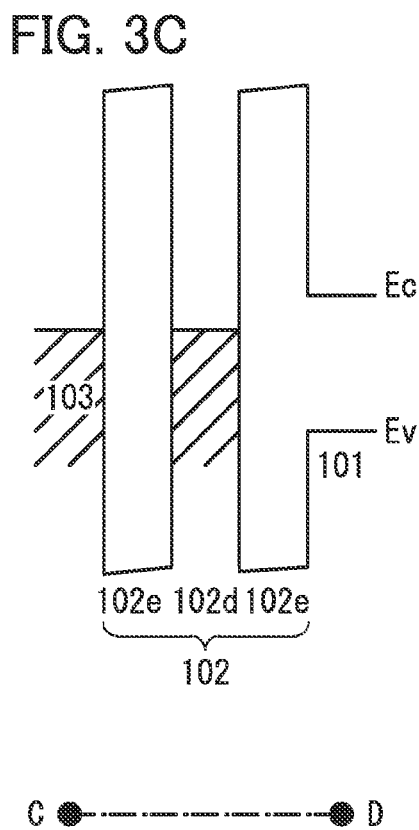
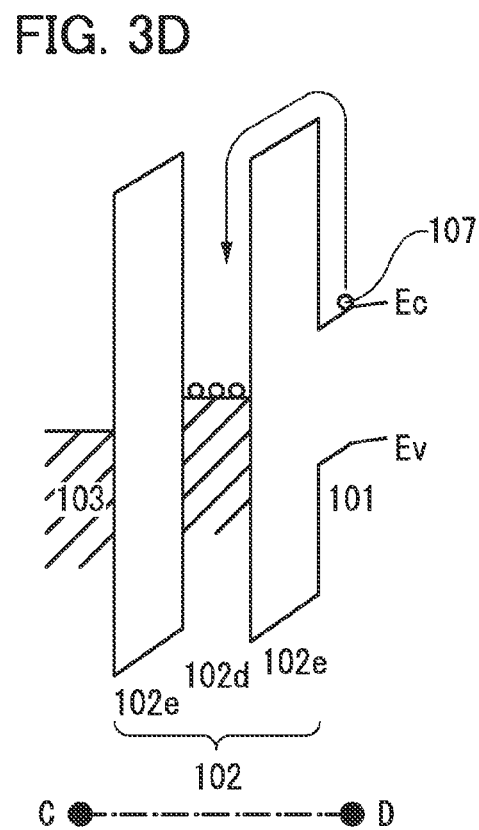

108 Id-Vg characteristic (before process)

109 Id-Vg characteristic (after process)

FIG. 6A
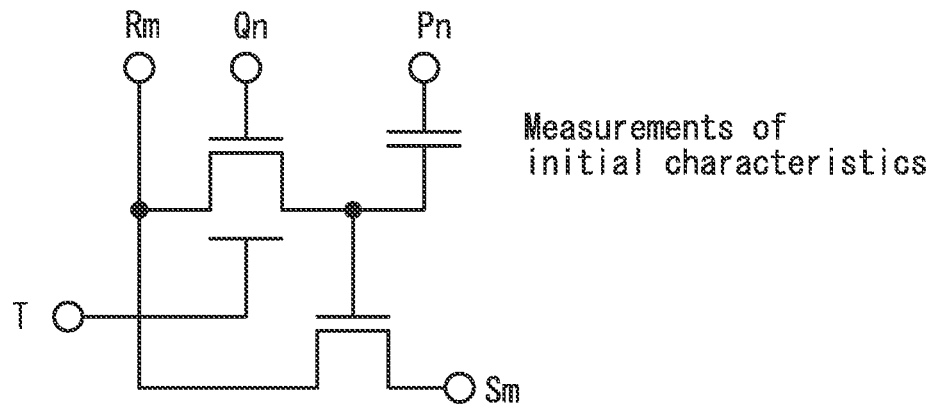
Measurements of initial characteristics
FIG. 6B
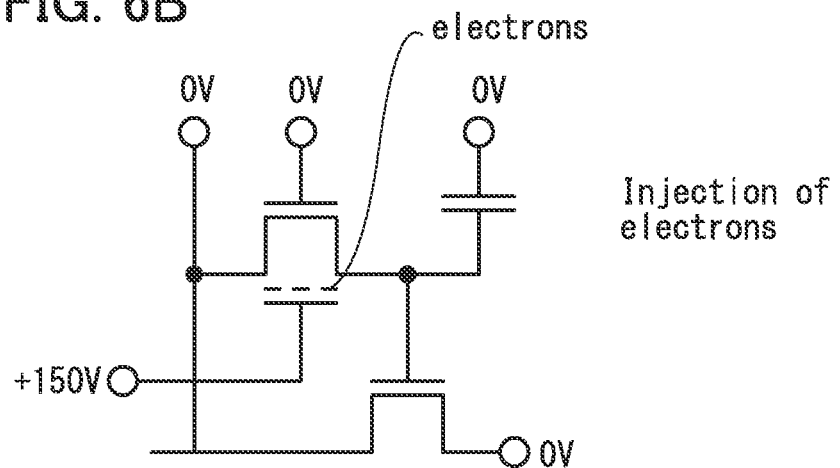
Injection of electrons
FIG. 6C
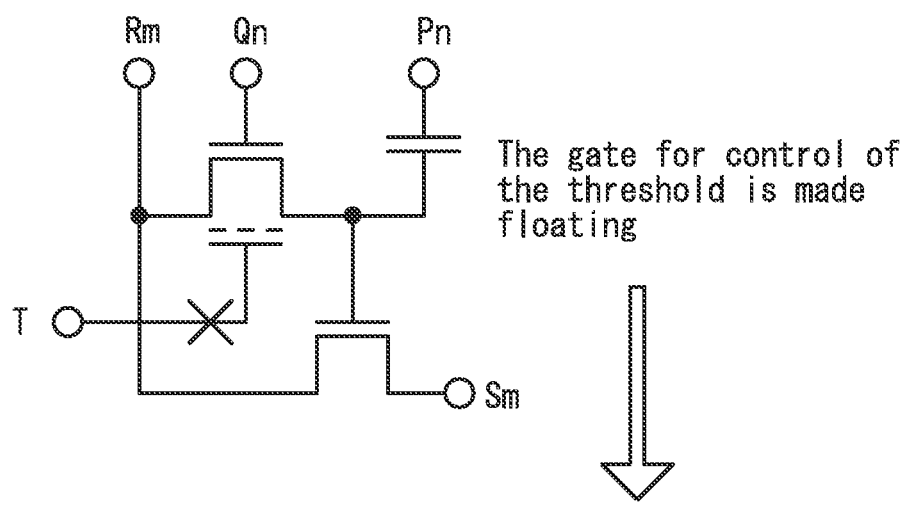
The gate for control of the threshold is made floating
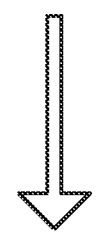
Resin sealing and packaging

FIG. 7A
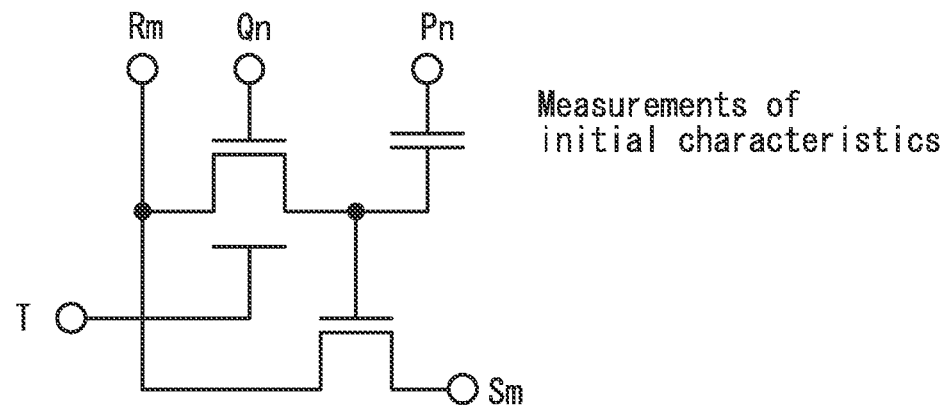
Measurements of initial characteristics
FIG. 7B
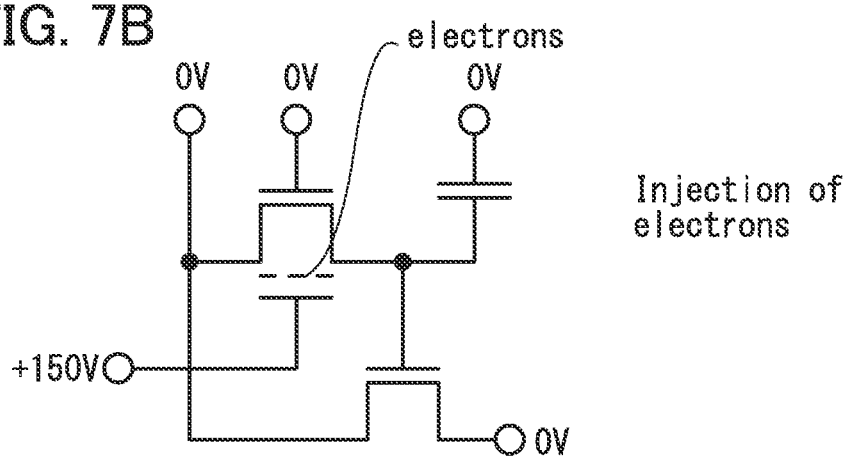
Injection of electrons
FIG. 7C
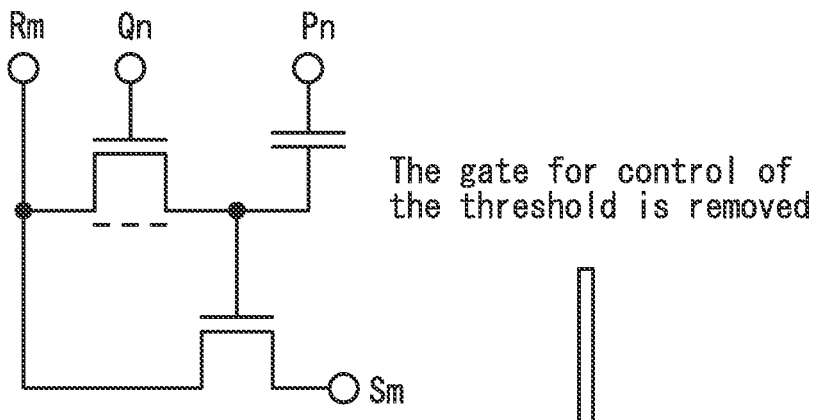
The gate for control of the threshold is removed
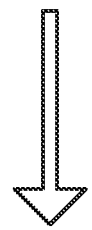
Resin sealing and packaging Measurements of initial characteristics Injection of electrons The gate for control of the threshold is grounded

⇓

Resin sealing and packaging

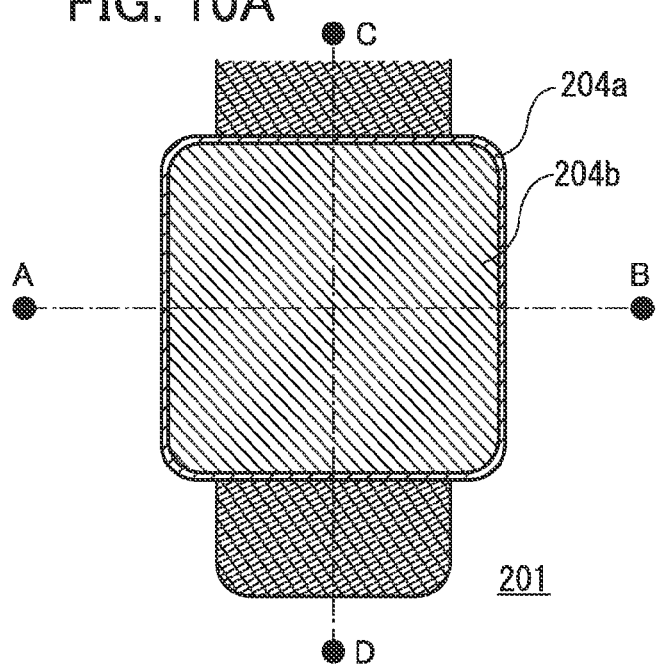
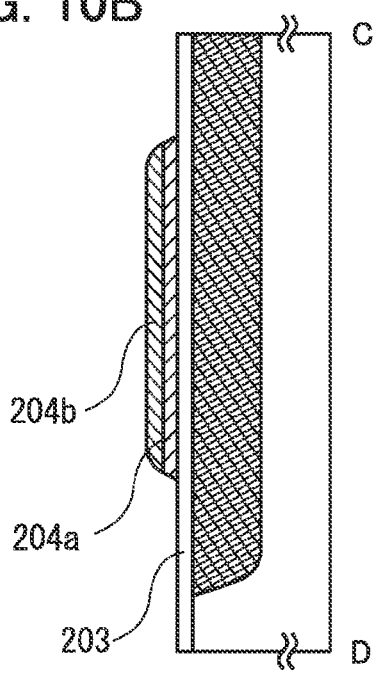
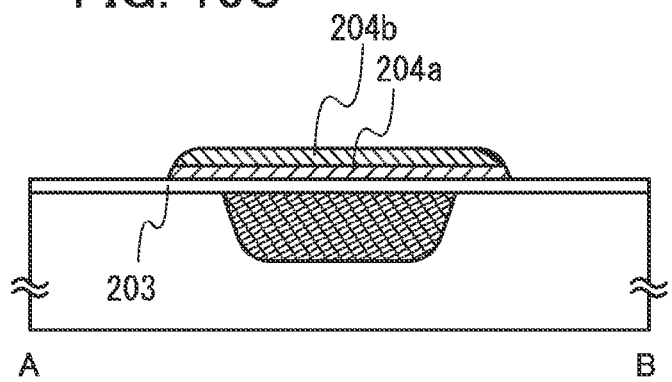

SEMICONDUCTOR DEVICE AND METHOD FOR MANUFACTURING SEMICONDUCTOR DEVICE

BACKGROUND OF THE INVENTION

1. Field of the Invention

One embodiment of the present invention relates to a semiconductor device.

2. Description of the Related Art

A transistor is used in a wide range of electronic devices such as an integrated circuit (IC) or an image display device (display device). As semiconductor materials that can be used in the transistor, silicon-based semiconductor materials have been widely known, but oxide semiconductors have been attracting attention as alternative materials.

For example, a transistor including an amorphous oxide semiconductor layer containing indium (In), gallium (Ga), and zinc (Zn) is disclosed in Patent Document 1.

Techniques for improving carrier mobility by employing a stacked structure of an oxide semiconductor layer are disclosed in Patent Documents 2 and 3.

It is known that a transistor including an oxide semiconductor layer has an extremely small leakage current when the transistor is off. For example, a low-power-consumption CPU utilizing such a small leakage current characteristic of a transistor including an oxide semiconductor layer is disclosed (see Patent Documents 4 and 5).

REFERENCE

Patent Document

[Patent Document 1] Japanese Published Patent Application No. 2006-165528
[Patent Document 2] Japanese Published Patent Application No. 2011-124360
[Patent Document 3] Japanese Published Patent Application No. 2011-138934
[Patent Document 4] Japanese Published Patent Application No. 2012-257187
[Patent Document 5] Japanese Published Patent Application No. 2012-074692

SUMMARY OF THE INVENTION

At least one of the following is an object of an embodiment of the present invention: the provision of a semiconductor device with adjusted (corrected) threshold, the provision of a semiconductor device having a structure that can prevent deterioration of electrical characteristics, the provision of a highly integrated semiconductor device, the provision of a semiconductor device in which deterioration of on-state current characteristics is reduced, the provision of a semiconductor device with low power consumption, the provision of a semiconductor device with high reliability, the provision of a semiconductor device which can retain data even when power supply is stopped, the provision of a semiconductor device with favorable characteristics, and one or more objects derived from the description of the specification, the drawings, the claims, and the like.

An embodiment is a method for manufacturing a semiconductor device, which includes a step of forming a semiconductor device including a first semiconductor, an electrode electrically connected to the first semiconductor, a first gate electrode and a second gate electrode between which the first semiconductor is positioned, a charge trap layer between the first gate electrode and the first semiconductor, and a gate insulating layer between the second gate electrode and the first semiconductor; a threshold adjustment step of trapping charges in the charge trap layer by keeping a potential of the first gate electrode at a potential higher than a potential of the electrode and a temperature higher than or equal to 125° C. and lower than or equal to 450° C. for 1 second or more; and a step of removing the first gate electrode from the semiconductor device after the threshold adjustment step.

At least one of the following effects described in this paragraph or the effects described in other paragraphs of this specification can be achieved: the provision of a semiconductor device with adjusted threshold, the provision of a semiconductor device having a structure that can prevent deterioration of electrical characteristics, which becomes more significant with the increasing miniaturization, the provision of a highly integrated semiconductor device, the provision of a semiconductor device with low power consumption, the provision of a semiconductor device with high reliability, the provision of a semiconductor device which can retain data even when power supply is stopped, and the provision of a novel semiconductor device or a manufacturing method thereof.

BRIEF DESCRIPTION OF THE DRAWINGS

In the accompanying drawings:

FIGS. 1A to 1C illustrate examples of a semiconductor device of an embodiment;

FIGS. 2A to 2C illustrate examples of a semiconductor device of an embodiment;

FIGS. 3A to 3D illustrate band diagram examples of a semiconductor device of an embodiment;

FIGS. 6A to 6C illustrate an example of a manufacturing process of a semiconductor device;

FIGS. 7A to 7C illustrate an example of a manufacturing process of a semiconductor device;

FIGS. 10A to 10C illustrate an example of a manufacturing process of a semiconductor device;

DETAILED DESCRIPTION OF THE INVENTION

Figure 4A:
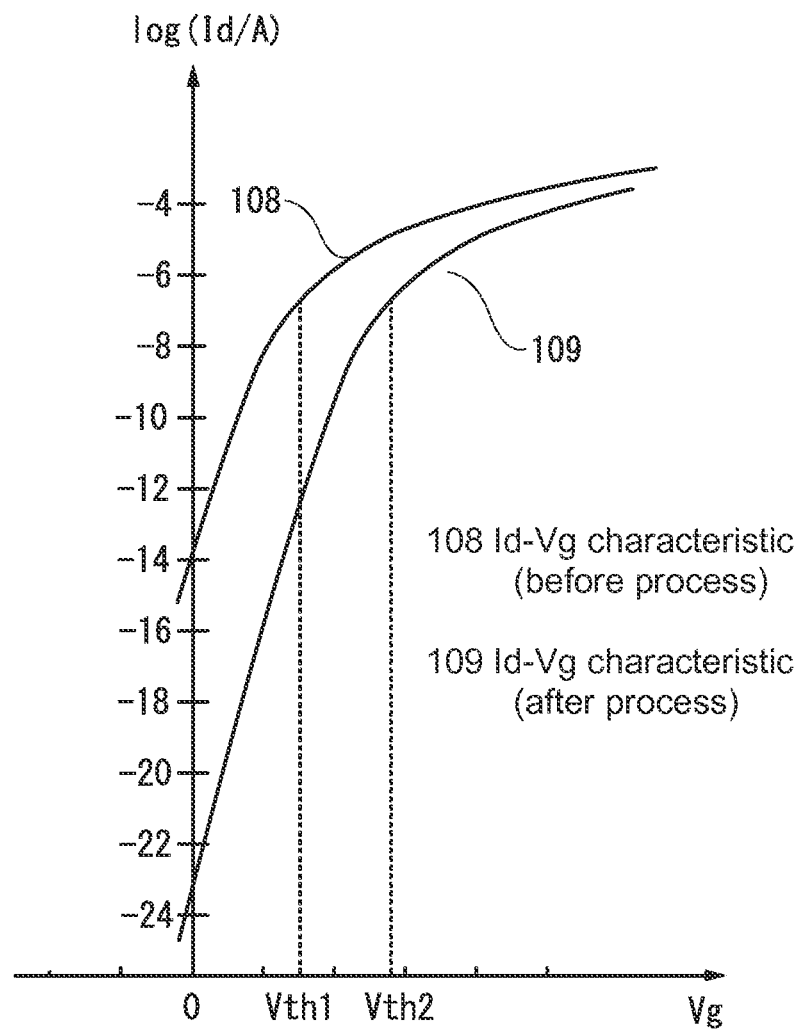
FIG. 4A schematically shows characteristics of a semiconductor device of an embodiment and FIG. 4B illustrates an example of a circuit in which the semiconductor device is used.

Embodiments will be described in detail with reference to drawings. The present invention is not limited to the description below, and it is easily understood by those skilled in the art that a variety of modifications can be made to the modes and details without departing from the spirit and scope of the present invention. Therefore, the present invention should not be interpreted as being limited to the description of the embodiments below.

Note that in structures described below, the same portions or portions having similar functions are denoted by the same reference numerals in different drawings, and description thereof is not repeated in some cases.

Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification.

Note that in this specification and the like, ordinal numbers such as "first" and "second" are used in order to avoid confusion among components and do not limit the components numerically.

Embodiment 1

In this embodiment, a structure and operation principles of a semiconductor device including a semiconductor layer, a charge trap layer, and a gate electrode, and a circuit to which the semiconductor device is used will be described. FIG. 1A illustrates a semiconductor device including a semiconductor layer 101, a charge trap layer 102, a gate electrode 103, a gate insulating layer 104, and a gate electrode 105.

Here, the charge trap layer 102 may be a stacked body that includes a first insulating layer 102a and a second insulating layer 102b as illustrated in FIG. 1B, for example. Alternatively, the charge trap layer 102 may be a stacked body that includes the first insulating layer 102a, the second insulating layer 102b, and a third insulating layer 102c as illustrated in FIG. 1C, or a stacked body including four or more insulating layers. Alternatively, the charge trap layer 102 may include an electrically insulated conductive layer 102d in an insulator 102e as illustrated in FIG. 2A. A plurality of insulating layers may constitute the insulator 102e.

FIG. 3A illustrates a band diagram example of the semiconductor device illustrated in FIG. 1B, from point A to point B. In the drawing, Ec represents a conduction band minimum and Ev represents a valence band maximum. In FIG. 3A, the potential of the gate electrode 103 is the same as the potential of a source electrode or a drain electrode (not illustrated).

In this example, the band gap of the first insulating layer 102a is wider than that of the second insulating layer 102b and the electron affinity of the first insulating layer 102a is lower than that of the second insulating layer 102b; however, the relations of the band gap and the electron affinity are not limited to those of this example.

Electron trap states 106 exist at the interface between the first insulating layer 102a and the second insulating layer 102b or inside the second insulating layer 102b. FIG. 3B shows the state where the potential of the gate electrode 103 is higher than the potential of the source or drain electrode. At this time, the potential of a surface of the semiconductor layer 101 on the gate electrode 103 side (process potential) may be initially set at a potential that is 1 V or more higher than the potential of the source or drain electrode. The process potential depends on the thickness of the charge trap layer 102. A preferable average electric field of the charge trap layer 102 is typically 4 MV/cm or lower.

At this time, the potential of the gate electrode 105 is preferably the same as the potential of the source or drain electrode. Electrons 107 that exist in the semiconductor layer 101 move toward the gate electrode 103 having a higher potential. Some of the electrons 107 moving from the semiconductor layer 101 toward the gate electrode 103 are trapped in the electron trap states 106.

There are some processes to enable the electrons 107 to go over the barrier of the first insulating layer 102a and reach the second insulating layer 102b. The first is a process by the tunnel effect. The thinner the first insulating layer 102a is, the more prominent the tunnel effect is. Note that electrons trapped by the electron trap states 106 may return to the semiconductor layer 101 by the tunnel effect.

Even when the first insulating layer 102a is relatively thick, the tunnel effect (Fowler-Nordheim tunnel effect) can be obtained by applying an appropriate voltage to the gate electrode 103. In the case of the Fowler-Nordheim tunnel effect, a tunnel current increases with the square of the electric field between the gate electrode 103 and the semiconductor layer 101.

The second is the process that the electrons 107 hop from trap states to trap states in the band gap such as defect states in the first insulating layer 102a to reach the second insulating layer 102b. This is a conduction mechanism called Poole-Frenkel conduction, in which as the absolute temperature is higher and trap states are shallower, the electric conductivity is higher.

The third is the process that the electrons 107 go over the barrier of the first insulating layer 102a by thermal excitation. The distribution of electrons existing in the semiconductor layer 101 follows the Fermi-Dirac distribution; in general, the proportion of electrons having high energy is larger as the temperature is higher. Assuming that the density of electrons having energy 3 eV higher than the Fermi level at 300 K (27° C.) is 1, for example, the density is $6 \times 10^{16}$ at 450 K (177° C.), $1.5 \times 10^{25}$ at 600 K (327° C.), and $1.6 \times 10^{30}$ at 750 K (477° C.).

The movement of the electrons 107 toward the gate electrode 103 by going over the barrier of the first insulating layer 102a occurs by the above three processes or a combination of these processes. In particular, the second and the third processes indicate that current increases exponentially as the temperature is higher.

Also, the Fowler-Nordheim tunnel effect is more likely to occur as the density of electrons in a thin part (a high-energy portion) of the barrier layer of the first insulating layer 102a is higher; thus, a higher temperature is better.

Note that in most cases, current generated by the conduction mechanism is weak in particular when the difference in potential between the gate electrode 103 and the semiconductor layer 101 is small (5 V or lower). However, by taking a long time (e.g., 1 second or more) for the process, a necessary number of electrons can be trapped by the electron trap states 106. As a result, the charge trap layer 102 is negatively charged.

In other words, when the potential of the gate electrode 103 is kept higher than that of the source or drain electrode at a high temperature (a temperature higher than the operating temperature or the storage temperature of the semiconductor device, or higher than or equal to 125° C. and lower than or equal to 450° C., typically higher than or equal to 150° C. and lower than or equal to 300° C.) for one second or longer, typically 1 minute or longer, electrons move from the semiconductor layer 101 toward the gate electrode 103 and some of them are trapped by the electron trap states 106. The temperature of the process for trapping electrons is referred to as process temperature below.

Here, the number of electrons trapped by the electron trap states 106 can be adjusted with the potential of the gate electrode 103. When a certain number of electrons are trapped by the electron trap states 106, due to the electric charge, the electric field of the gate electrode 103 is blocked and a channel formed in the semiconductor layer 101 disappears.

The total number of electrons trapped by the electron trap states 106 increases linearly at first, and then, the rate of increase gradually decreases and the total number of electrons converges at a certain value. The convergence value depends on the potential of the gate electrode 103. As the potential is higher, the number of trapped electrons tends to be larger, however, it never exceeds the total number of electron trap states 106.

The electrons trapped by the electron trap states 106 are required not to transfer from the charge trap layer 102 to the other regions. For this, the thickness of the first and second insulating layers 102a and 102b is preferably set at a thickness at which the tunnel effect is not a problem. For example, the physical thickness is preferably more than 1 nm.

However, electron transfer is hindered if the thickness of the first insulating layer 102a is too large; thus, 30 nm or smaller is preferable. Furthermore, if the thickness of the first and second insulating layers 102a and 102b is too large as compared with the channel length of the semiconductor device, the subthreshold value is increased to degrade the off-state characteristics. For this reason, the channel length is more than or equal to four times, typically more than or equal to ten times as large as the equivalent silicon oxide thickness of the first and second insulating layers 102a and 102b. Note that when a so-called High-K material is used, the equivalent silicon oxide thickness is less than the physical thickness.

The thickness of the first insulating layer 102a is typically more than or equal to 10 nm and less than or equal to 20 nm, and the equivalent silicon oxide thickness of the second insulating layer 102b is more than or equal to 1 nm and less than or equal to 25 nm.

Another method is to set the operating temperature or the storage temperature of the semiconductor device at a temperature that is lower enough than the process temperature. For example, the process temperature is set at 300° C., and the semiconductor device is stored at 120° C. or lower. The probability that electrons go over a 3 eV-barrier when the temperature is 120° C. is less than a one hundred-thousandth that when the temperature is 300° C. In this way, although electrons easily go over a barrier to be trapped by the charge trap states 106 during the process at 300° C., the electrons go with difficulty over the barrier during storage at 120° C. and are kept trapped by the electron trap states 106 for a long time.

It is also effective that the effective mass of a hole is extremely large or is substantially localized in the semiconductor layer 101. In this case, the injection of holes from the semiconductor layer 101 to the first and second insulating layers 102a and 102b does not occur and consequently a phenomenon in which electrons trapped by the electron trap states 106 are bonded to holes and then disappear does not occur.

A material exhibiting Poole-Frenkel conduction may be used for the second insulating layer 102b. The Poole-Frenkel conduction is, as described above, electron hopping conduction between defect states and the like in a material. A material including a large number of defect states or including deep defect states has low electric conductivity and consequently can hold electrons trapped by the electron trap states 106 for a long time.

Circuit design or material selection may be made so that no voltage at which electrons trapped in the first and second insulating layers 102a and 102b are released is applied. For example, in a material whose effective mass of holes is extremely large or is substantially localized, such as an In—Ga—Zn-based oxide semiconductor, a channel is formed when the potential of the gate electrode 103 is higher than that of the source or drain electrode; however, when the potential of the gate electrode 103 is lower than that of the source or drain electrode, the material shows characteristics similar to an insulator. In this case, the electric field between the gate electrode 103 and the semiconductor layer 101 is extremely small and consequently the Fowler-Nordheim tunnel effect or electron conduction according to the Poole-Frenkel conduction is significantly decreased.

To hold electrons trapped by the electron trap states inside the second insulating layer 102b or at the interface with another insulating layer, it is effective that the charge trap layer 102 is formed of three insulating layers as illustrated in FIG. 1C, that the electron affinity of the third insulating layer 102c is smaller than that of the second insulating layer 102b, and that the bandgap of the third insulating layer 102c is larger than that of the second insulating layer 102b.

In this case, if the physical thickness of the third insulating layer 102c is large enough, electrons trapped by the electron trap states 106 can be held even when the second insulating layer 102b has a small thickness. As a material of the third insulating layer 102c, the same material as or a material similar to that of the first insulating layer 102a can be used. Alternatively, a material whose constituent elements are the same as those of the second insulating layer 102b but number of electron trap states is small enough may be used. The number (density) of electron trap states depends on the formation method.

Note that when the electrically insulated conductive layer 102d is surrounded by the insulator 102e as illustrated in FIG. 2A, electrons are trapped in the conductive layer 102d according to the above principle. FIGS. 3C and 3D illustrate examples of such a case. In FIG. 3C, the potential of the gate electrode 103 is equal to that of the source or drain electrode.

FIG. 3D shows the state where the potential of the gate electrode 103 is higher than the potential of the source or drain electrode. Electrons 107 that exist in the semiconductor layer 101 move toward the gate electrode 103 having a higher potential. Some of the electrons 107 moving from the semiconductor layer 101 toward the gate electrode 103 are trapped in the conductive layer 102d. In other word, in the semiconductor device illustrated in FIG. 2A, the conductive layer 102d functions as the electron trap states 106 in the semiconductor device in FIG. 1B.

Note that when the work function of the conductive layer 102d is large, an energy barrier to the insulator 102e is high and consequently the trapped electrons can be prevented from moving out from the conductive layer 102d.

In the above structure, each of the first to third insulating layers 102a to 102c may be composed of a plurality of insulating layers. A plurality of insulating layers containing the same constituting elements and formed by different formation methods may be used.

When the first and second insulating layers 102a and 102b are formed using insulating layers formed of the same constituting elements (e.g., hafnium oxide), the first insulating layer 102a may be formed by a chemical vapor deposition (CVD) method such as a metal organic chemical vapor deposition (MOCVD) method, an atomic layer deposition (ALD) method, or a plasma-enhanced CVD (PECVD) method and the second insulating layer 102b may be formed by a sputtering method.

Note that the first insulating layer 102a and the second insulating layer 102b may be formed by different CVD methods.

In general, an insulating layer formed by a sputtering method includes more defects than an insulating layer formed by a CVD method, and thus has stronger electron trapping characteristics. From this reason, the second insulating layer 102b may be formed by a sputtering method and the third insulating layer 102c may be formed by a CVD method when the second and third insulating layers 102b and 102c contain the same constituent elements.

When the second insulating layer 102b is formed using a plurality of insulating layers containing the same constituent elements, one insulating layer may be formed by a sputtering method and another insulating layer may be formed by a CVD method.

The threshold of a semiconductor device is increased by the trap of electrons in the charge trap layer 102. In particular, when the semiconductor layer 101 is formed using a wide band gap material, a source-drain current (Icut) when the potential of the gate electrodes 103 and 105 is equal to the potential of the source electrode can be significantly decreased.

For example, the Icut per micrometer of a channel width of an In—Ga—Zn-based oxide whose band gap is 3.2 eV is 1 zA/μm ($1 \times 10^{-21}$ A/μm) or less, typically 1 yA/μm ($1 \times 10^{-24}$ A/μm) or less.

FIG. 4A schematically shows dependence of current per micrometer of channel width (Id) between source and drain electrodes on the potential of the gate electrode 105 (Vg) at room temperature, before and after electron trap in the charge trap layer 102. The potential of the source electrode and the gate electrode 103 is 0 V and the potential of the drain electrode is +1 V. Although current smaller than 1 fA cannot be measured directly, it can be estimated from a value measured by another method, the subthreshold value, and the like.

As indicated by a curve 108, the threshold of the semiconductor device is Vth1 at first. After electron trapping, the threshold increases (shifts in the positive direction) to become Vth2. As a result, Icut per micrometer of a channel width becomes 1 aA/μm ($1 \times 10^{-18}$ A/μm) or less, for example, greater than or equal to 1 zA/μm and less than or equal to 1 yA/μm.

Figure 4B:
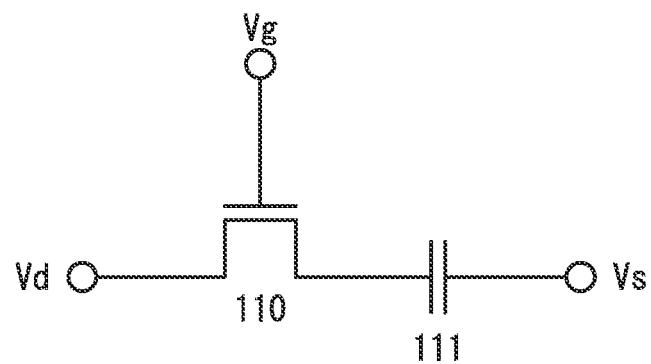

FIG. 4B illustrates a circuit in which charge stored in a capacitor 111 is controlled by a transistor 110. Leakage current between electrodes of the capacitor 111 is ignored here. The capacitance of the capacitor 111 is 1 fF, the potential of the capacitor 111 on the transistor 110 side is +1 V, and the potential of Vd is 0 V.

The curve 108 in FIG. 4A denotes the Id-Vg characteristics of the transistor 110. When the channel width is 0.1 μm, the Icut is approximately 1 fA and the resistivity of the transistor 110 at this time is approximately $1 \times 10^{15} \Omega$. Accordingly, the time constant of a circuit composed of the transistor 110 and the capacitor 111 is approximately one second. This means that most of the charge stored in the capacitor 111 is lost in approximately one second.

The curve 109 in FIG. 4A denotes the Id-Vg characteristics of the transistor 110. When the channel width is 0.1 μm, the Icut is approximately 1 yA and the resistivity of the transistor 110 at this time is approximately $1 \times 10^{24} \Omega$. Accordingly, the time constant of the circuit composed of the transistor 110 and the capacitor 111 is approximately $1 \times 10^9$ seconds (=approximately 31 years). This means that one-third of the charge stored in the capacitor 111 is left after 10 years.

From this, charge can be held for 10 years in a simple circuit composed of a transistor and a capacitor. This can be applied to various kinds of memory devices, such as memory cells illustrated in FIGS. 5A and 5B.

Figure 5A:
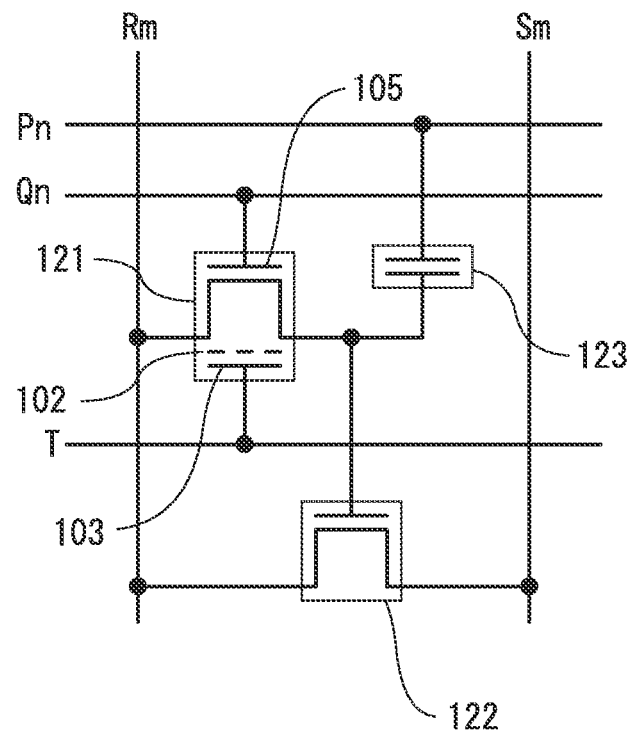
FIGS. 5A and 5B illustrate examples of a memory cell of an embodiment.

The memory cell illustrated in FIG. 5A includes a transistor 121, a transistor 122, and a capacitor 123. The transistor 121 includes the charge trap layer 102 as illustrated in FIG. 1A. After the circuit is formed, the above-described process for increasing the threshold is performed to lower Icut. Note that in the drawing, the transistor that includes electrons in the charge trap layer 102 for threshold adjustment is represented by a symbol that is different from the symbol for a normal transistor.

Memory cells such as the one illustrated in FIG. 5A are formed in a matrix. For example, to the memory cell in the n-th row and m-th column, a read word line Pn, a write word line Qn, a threshold correction wiring T, a bit line Rm, and a source line Sm are connected. Note that a circuit configuration in which all the threshold correction wirings are connected to each other may be employed so that all the threshold correction wirings can have the same potential. For example, the threshold correction wirings may be a conductive layer that covers the entire circuit.

The threshold correction can be performed as follows. First, potentials of all read word lines, all write word lines, all source lines, and all bit lines are set at 0 V. Then, a wafer or chip over which the memory cells are formed is set at an appropriate temperature and the potentials of all the threshold correction wiring are set at an appropriate value (e.g., +3 V), and these conditions are held for an appropriate period. In this way, the threshold becomes an appropriate value. The process for adjusting the threshold by trapping electrons in the charge trap layer 102 in the above-described manner is also referred to as threshold adjustment process.

Figure 5B:
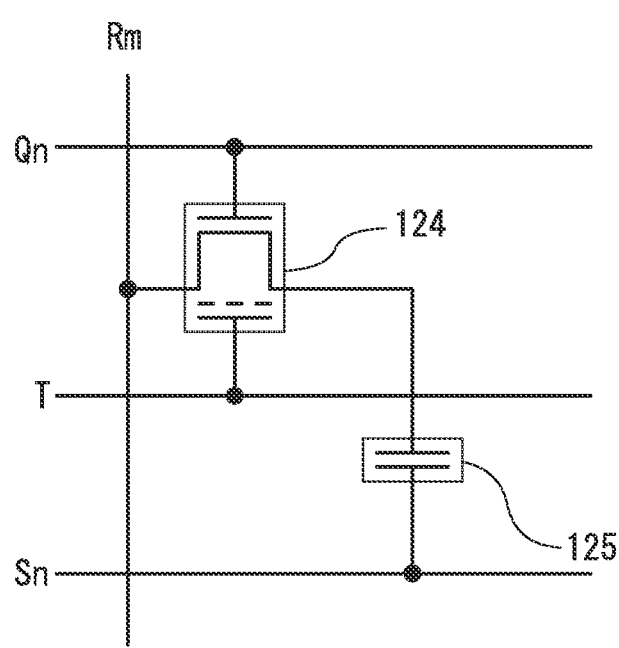

Note that the memory cell may have a structure including a transistor 124 and a capacitor 125 as illustrated in FIG. 5B. For example, to the memory cell in the n-th row and m-th column, a word line Qn, a threshold correction wiring T, a bit line Rm, and a source line Sn are connected. The threshold adjustment process can be similar to that in the case of FIG. 5A.

When the threshold is adjusted to an appropriate value by making the charge trap layer trap electrons as described above, it is preferable to avoid further addition of electrons to the charge trap layer in normal use after that. Further addition of electrons means a further increase of threshold, resulting in circuit deterioration.

When the charge trap layer is in the vicinity of a semiconductor layer, and a wiring or an electrode whose potential is higher than that of the semiconductor layer faces the semiconductor layer with the charge trap layer sandwiched therebetween, electrons might be trapped in the charge trap layer in normal use.

This can be solved by setting the potential of the threshold correction wiring T at a potential lower than or equal to the lowest possible potential of the bit line Rm in the memory cell shown in FIG. 5A or 5B, for example. Alternatively, as described later, the gate electrode 103 may be provided far enough from the semiconductor layer or removed after the threshold adjustment process.

The increase in the threshold depends on the density of electrons trapped by the charge trap layer 102. For example, in the semiconductor device illustrated in FIG. 1B, in the case where electrons are trapped only at the interface between the first insulating layer 102a and the second insulating layer 102b, the threshold is increased by Q/C, where Q is the surface density of trapped electrons and C is the dielectric constant of the first insulating layer 102a.

As described above, the potential of the gate electrode 103 determines the value at which the number of trapped electrons converges. Accordingly, the increase in the threshold can be adjusted by the potential of the gate electrode 103.

As an example, a case in which the potential of the gate electrode 103 is set higher than the potentials of the source electrode and the drain electrode by 1.5 V and the temperature is set at higher than or equal to 150° C. and lower than or equal to 250° C. typically 200° C.±20° C. is considered. Assuming that the threshold of the semiconductor device before electrons are trapped in the charge trap layer 102 (first threshold, Vth1) is +1.1 V, a channel is formed in the semiconductor layer 101 at first and electrons are trapped in the charge trap layer 102. Then, the number of trapped electrons in the charge trap layer 102 increases, and the channel disappears. At this stage, trap of electrons in the charge trap layer 102 stops.

In this case, because the channel disappears when the potential of the gate electrode 103 is higher than the potentials of the source electrode and the drain electrode by 1.5 V, the threshold becomes +1.5 V. It can also be said that the threshold is increased by 0.4 V by electrons trapped in the charge trap layer 102. The threshold that has been changed by electrons trapped in the charge trap layer 102 is referred to as a second threshold (Vth2).

By utilizing these characteristics, the thresholds of a plurality of semiconductor devices which are initially largely different from each other can converge at values within an appropriate range. For example, if three semiconductor devices with the first thresholds of +1.2 V, +1.1 V, and +0.9 V are subjected to the process under above-described conditions, trap of electrons does not make the threshold to become significantly higher than +1.5 V in each semiconductor device; the second threshold of each semiconductor device can become approximately +1.5 V. After the threshold adjustment process, the number of trapped electrons in the charge trap layer 102 (or the surface density of electrons, or the like) is different among the three semiconductor devices.

Any of a variety of materials can be used for the gate electrode 103. For example, a conductive layer of Al, Ti, Cr, Co, Ni, Cu, Y, Zr, Mo, Ru, Ag, Ta, W, or the like can be used. The gate electrode 103 may have a stacked-layer structure of any of the above materials. Alternatively, a conductive layer containing nitrogen may be used as the gate electrode 103. For example, a titanium nitride layer over which a tungsten layer is stacked, a tungsten nitride layer over which a tungsten layer is stacked, a tantalum nitride layer over which a tungsten layer is stacked, or the like can be used as the gate electrode 103.

Note that the work function of the gate electrode 103 that faces the semiconductor layer 101 is one factor determining the threshold of the semiconductor device; in general, as the work function of a material is smaller, the threshold becomes lower. However, as described above, the threshold can be adjusted by adjusting the number of trapped electrons in the charge trap layer 102; accordingly, the range of choices for the material of the gate electrode 103 can be widened.

Any of a variety of materials can be used for the semiconductor layer 101. For example, other than silicon, germanium, and silicon germanium, any of a variety of oxide semiconductors described later can be used.

Any of a variety of materials can be used for the first insulating layer 102a. For example, an insulating layer containing one or more kinds selected from magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide can be used.

The second insulating layer 102b can be formed using any of a variety of materials. For example, an insulating layer including one or more kinds selected from hafnium oxide, aluminum oxide, tantalum oxide, aluminum silicate, and the like can be used.

The third insulating layer 102c can be formed using any of a variety of materials. For example, an insulating layer including one or more kinds selected from magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide can be used.

Any of a variety of materials can be used for the conductive layer 102d. For example, a conductive layer of Al, Ti, Cr, Co, Ni, Cu, Y, Zr, Mo, Ru, Ag, Ta, W, Pt, Pd, or the like can be used. The conductive layer 102d may be a stack of any of the above materials. Alternatively, a conductive layer containing nitrogen may be used as the conductive layer 102d.

In particular, as a material having a large work function, a metal of the platinum group such as platinum or palladium; a nitride such as indium nitride, zinc nitride, In—Zn-based oxynitride, In—Ga-based oxynitride, or In—Ga—Zn-based oxynitride; or the like may be used.

Any of a variety of materials can be used for the insulator 102e. For example, silicon oxide, silicon nitride, silicon oxynitride, silicon nitride oxide, aluminum oxide, or tantalum oxide can be used.

The semiconductor device in which the necessary amount of electrons is trapped in the charge trap layer 102 as described above is equivalent to a general MOS semiconductor device. When the semiconductor device is used as a MOS semiconductor device, it is preferable that the potential of the gate electrode 103 after the threshold adjustment process be always set at the lowest potential in the circuit. Alternatively, the gate electrode 103 may be removed. Further alternatively, the gate electrode 103 may be cut from other circuits to be in a floating state.

Note that the timing of the threshold adjustment process may be any of the following timings before leaving the factory, for example: after formation of a wiring metal connected to the source electrode or the drain electrode of the semiconductor device, after backplane process (wafer process), after wafer dicing, and after packaging. In either case, it is preferable that the semiconductor device be not exposed to temperatures of 125° C. or higher for 1 hour or more after the threshold adjustment process.

In the case where the threshold adjustment process is not performed in normal use but is performed only once before leaving the factory, the potential applied to the gate electrode 103 can be selected from a variety of potentials. For example, a potential that is not used in normal use can be employed.

For example, even when the third insulating layer 102c is made significantly thicker than the first insulating layer 102a and the second insulating layer 102b as illustrated in FIG. 2B, application of an adequate potential to the gate electrode 103 enables trap of electrons in the second insulating layer 102b. For example, the third insulating layer 102c may be thick so that the charge trap layer 102 has a thickness of 500 nm or more.

For example, it is assumed that the threshold adjustment process is performed with a potential difference between the gate electrode 103 and the semiconductor layer 101 of 1.5 V when the first insulating layer 102a, the second insulating layer 102b, and the third insulating layer 102c each have an equivalent silicon oxide thickness of 10 nm. If the same threshold adjustment process is performed on the semiconductor device where the first and second insulating layers 102a and 102b each have an equivalent silicon oxide thickness of 10 nm and the third insulating layer 102c has an equivalent silicon oxide thickness of 1 µm, the potential difference between the gate electrode 103 and the semiconductor layer 101 is set at 150 V.

In general, when the equivalent silicon oxide thickness of the third insulating layer 102c is X [µm], the potential difference [V] between the gate electrode 103 and the semiconductor layer 101 preferably has a value obtained by multiplying X by 10 to 400. However, the potential difference is not limited to the value in this range.

When utilizing this feature, the second insulating layer 102b may be formed over a semiconductor circuit (including the semiconductor layer 101), a protective insulating layer with an adequate thickness (e.g., 0.5 µm to 10 µm) may be formed, a conductive layer may be formed to cover the circuit, and then a potential difference according to the thickness of the protective insulating layer between the semiconductor circuit and the conductive layer may be applied. In this case, the conductive layer corresponds to the gate electrode 103, and the protective insulating layer corresponds to part of or the entire third insulating layer 102c.

After the threshold adjustment process, the conductive layer may be removed. Alternatively, the conductive layer may be insulated from other circuits, that is, in a floating state. Since the protective insulating layer has an adequate thickness, the conductive layer hardly affects the second insulating layer 102b or the semiconductor layer 101.

The same can apply to the semiconductor device illustrated in FIG. 2A. In that case, the conductive layer 102d is separated from the gate electrode 103 by the insulator 102e having an adequate thickness (e.g., 0.5 µm to 10 µm) as illustrated in FIG. 2C.

For example, steps illustrated in FIGS. 6A to 6C can be performed. After memory cells are formed, first, initial characteristics are measured to select a conforming item (see FIG. 6A). Here, items without malfunctions that cannot be recovered due to a break in a wire or the like are regarded as conforming items. At this stage, the threshold has not been adjusted to an appropriate value and thus charge in the capacitor cannot be held for a long time; however, this is not the criteria of selection.

Then, electrons are injected as illustrated in FIG. 6B. In other words, an appropriate number of electrons are trapped in the charge trap layer. This operation is performed in the above-described manner. Here, in the case where the threshold correction wiring T is a conductive layer formed over the protective insulating layer as described above, a potential can be supplied by making a probe in contact with the conductive layer. Note that it is preferable that the conductive layer is insulated from other circuits (e.g., the read word line Pn, the write word line Qn, the bit line Rm, the source line Sm) or in a state close to the state where it is insulated therefrom. In this case, other circuits can have the same potential by setting the potentials of all potential supply terminals and signal supply terminals at the same potential. Here, the read word line Pn, the write word line Qn, the bit line Rm, and the source line Sm have a potential of 0 V and the threshold correction wiring T (the gate electrode 103) has a potential of +150 V although depending on the thickness of the protective insulating layer.

As illustrated in FIG. 6C, at the stage when the probe is detached from the conductive layer formed over the protective insulating layer, the conductive layer (the threshold correction wiring T) is brought into a floating state.

Then, measurement is performed again. One of the criteria for conforming items is the threshold increased as planned. At this stage, chips with a threshold abnormality are regarded as nonconforming items, and these chips may again be subjected to electron injection. Conforming items are shipped after dicing, resin sealing, and packaging.

FIGS. 7A to 7C illustrate another example of steps. The steps of FIGS. 7A and 7B are the same as the steps of FIGS. 6A and 6B. After a conforming item is obtained after the threshold adjustment process, the conductive layer (the threshold correction wiring T) is removed as illustrated in FIG. 7C.

Figure 8A:
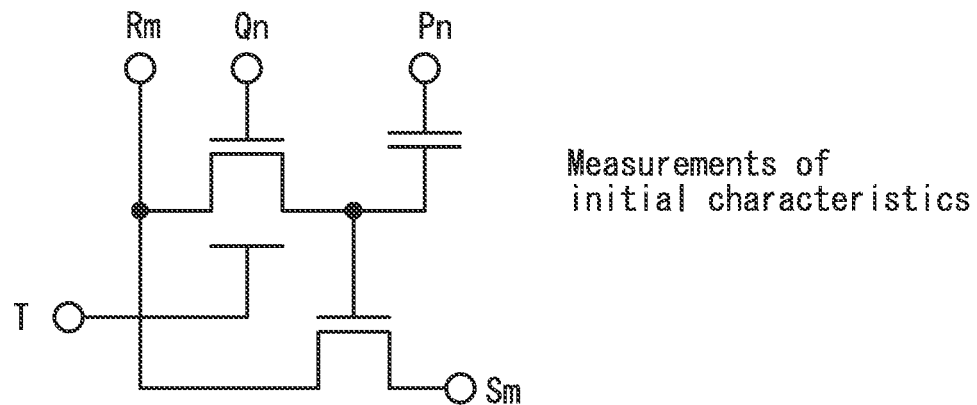
FIGS. 8A to 8C illustrate an example of a manufacturing process of a semiconductor device.
Figure 8B:
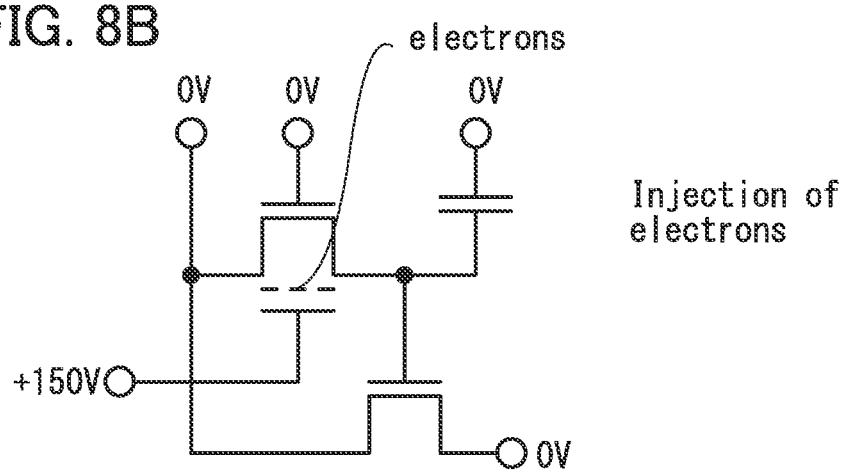
Figure 8C:
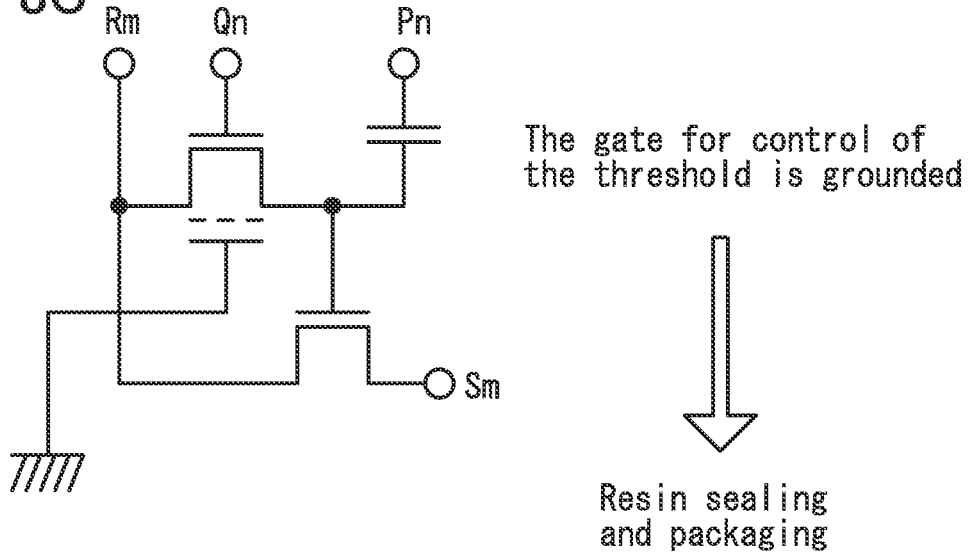

FIGS. 8A to 8C illustrate another example of steps. The steps of FIGS. 8A and 8B are the same as the steps of FIGS. 6A and 6B. After a conforming item is obtained after the threshold adjustment process, the conductive layer (the threshold correction wiring T) is bonded to a wiring having an appropriate constant potential such as the lowest potential in the circuit (e.g., a ground potential) as illustrated in FIG. 8C.

Although the case of trapping electrons has been described so far, the same can apply to a case of trapping holes.

Embodiment 2

In this embodiment, a semiconductor device is described with reference to drawings. First, an example of a method for manufacturing a semiconductor device (transistor) is described with reference to FIGS. 9A to 9C, FIGS. 10A to 10C, FIGS. 11A to 11C, and FIGS. 12A to 12C.

Figure 9A:
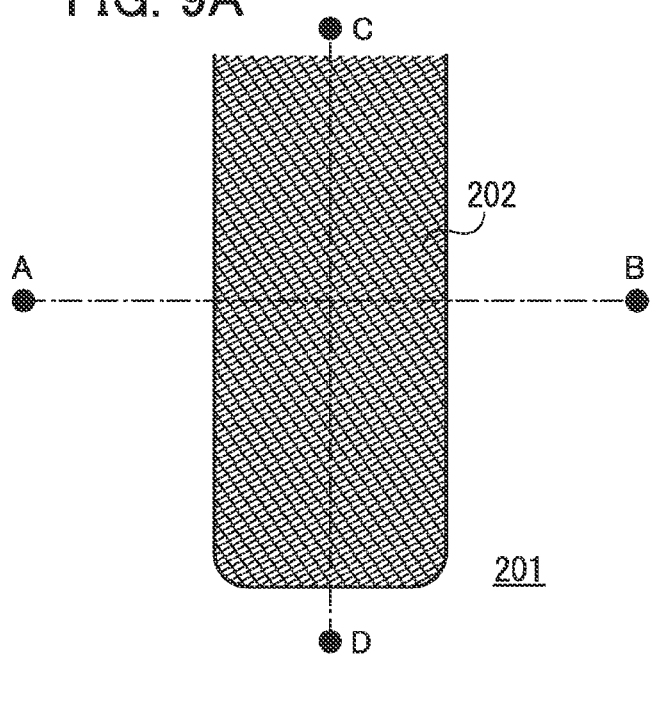
FIGS. 9A to 9C illustrate an example of a manufacturing process of a semiconductor device.
Figure 9B:
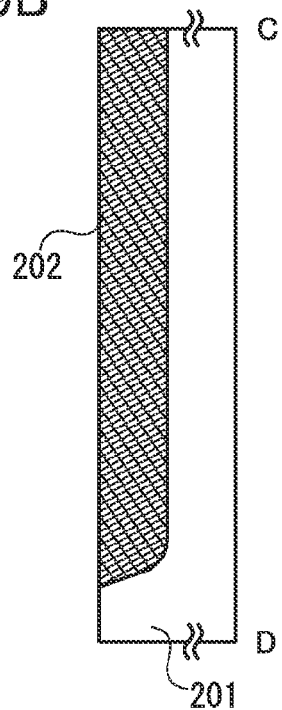
Figure 9C:
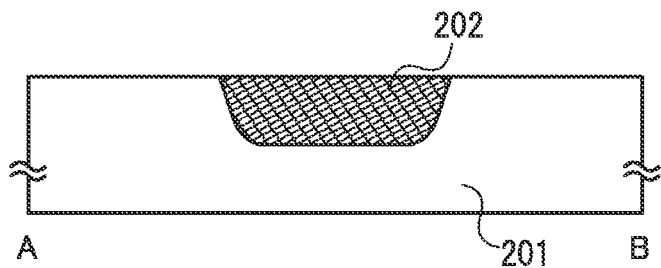

FIGS. 9A to 9C are a top view and cross-sectional views illustrating a transistor in the middle of manufacturing. FIG. 9A is the top view. FIG. 9C illustrates a cross section taken along the dashed-dotted line A-B in FIG. 9A, and FIG. 9B illustrates a cross section taken along the dashed-dotted line C-D in FIG. 9A. Note that for drawing simplicity, some components are not illustrated in the top view of FIG. 9A. In some cases, the direction of the dashed-dotted line A-B is referred to as a channel length direction, and the direction of the dashed-dotted line C-D is referred to as a channel width direction. The same can apply to FIGS. 10A to 10C and FIGS. 11A to 11C.

FIGS. 9A to 9C illustrate a gate electrode 202 buried in an insulator 201. The gate electrode 202 extends in the direction indicated by the dashed-dotted line C-D. For example, the insulator 201 can be formed using a material that can be used in the first insulating layer 102a described in Embodiment 1. For example, the gate electrode 202 can be formed using a material that can be used in the gate electrode 103 described in Embodiment 1.

For example, the insulator 201 does not simply serve as a supporting material, but a device such as a transistor is formed under the insulator 201. In this case, at least one of the gate electrode 202 and a source electrode 205a and a drain electrode 205b, which are described later, may be electrically connected to another device.

For example, the insulator 201 has a function of preventing diffusion of impurities from the lower side. In the case where another device is formed under the insulator 201 as described above, the insulator 201 also serves as an interlayer insulator. For example, the insulator 201 is subjected to planarization treatment such as chemical mechanical polishing (CMP) treatment so as to have a flat surface. Similarly, the gate electrode 202 is preferably subjected to planarization treatment so as to have a surface that is substantially aligned with the surface of the insulator 201.

Oxygen may be added to the insulator 201 by an ion implantation method, an ion doping method, a plasma immersion ion implantation method, or the like.

FIGS. 10A to 10C are a top view and cross-sectional views illustrating a state where a gate insulating layer 203 is formed over the gate electrode 202 and an oxide semiconductor layer 204a and an oxide semiconductor layer 204b each having a rectangular shape are stacked over the gate insulating layer 203. For example, the gate insulating layer 203 can be formed using a material that can be used for the gate insulating layer 104 described in Embodiment 1. Materials of the oxide semiconductor layer 204a and the oxide semiconductor layer 204b are described later.

The oxide semiconductor layers 204a and 204b can be formed by a sputtering method, a CVD method such as a MOCVD method, an ALD method, or a PECVD method, a vacuum evaporation method, or a pulse laser deposition (PLD) method.

For processing the oxide semiconductor layer 204a and the oxide semiconductor layer 204b into rectangular shapes, for example, a layer to be a hard mask (e.g., a tungsten layer) and a resist mask are provided over the oxide semiconductor layer 204b, and the layer to be a hard mask is etched to form a hard mask. The resist mask is removed and then the oxide semiconductor layer 204a and the oxide semiconductor layer 204b are etched using the hard mask as a mask. Then, the hard mask is removed. At this step, the hard mask is gradually reduced as the etching progresses; as a result, the edges of the hard mask are rounded to have a curved surface. Accordingly, the edges of the oxide semiconductor layer 204b are rounded to have a curved surface. This structure improves the coverage with an oxide semiconductor layer 204c, a first insulating layer 206, a second insulating layer 207, and a third insulating layer 208, which are to be formed over the oxide semiconductor layer 204b (and described later), and can prevent shape defects such as disconnection. In addition, electric field concentration which might occur at end portions of the source electrode 205a and the drain electrode 205b can be reduced, which can reduce deterioration of the transistor.

In order to form a later-described continuous junction in stacked layers including the oxide semiconductor layers 204a and 204b, or stacked layers also including the oxide semiconductor layer 204c to be formed in a later step, the layers need to be formed successively without exposure to the air with the use of a multi-chamber deposition apparatus (e.g., a sputtering apparatus) including a load lock chamber. It is preferable that each chamber of the sputtering apparatus be able to be evacuated to a high vacuum (to about $5 \times 10^{-7}$ Pa to $1 \times 10^{-4}$ Pa) by an adsorption vacuum pump such as a cryopump and that the chamber be able to heat a substrate to 100° C. or higher, preferably 500° C. or higher so that water and the like acting as impurities for the oxide semiconductor can be removed as much as possible. Alternatively, a combination of a turbo molecular pump and a cold trap is preferably used to prevent back-flow of a gas containing a carbon component, moisture, or the like from an exhaust system into the chamber.

Not only high vacuum evacuation in a chamber but also increasing the purity of a sputtering gas is necessary to obtain a high-reliability oxide semiconductor. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor layer can be prevented as much as possible.

Figure 11A:
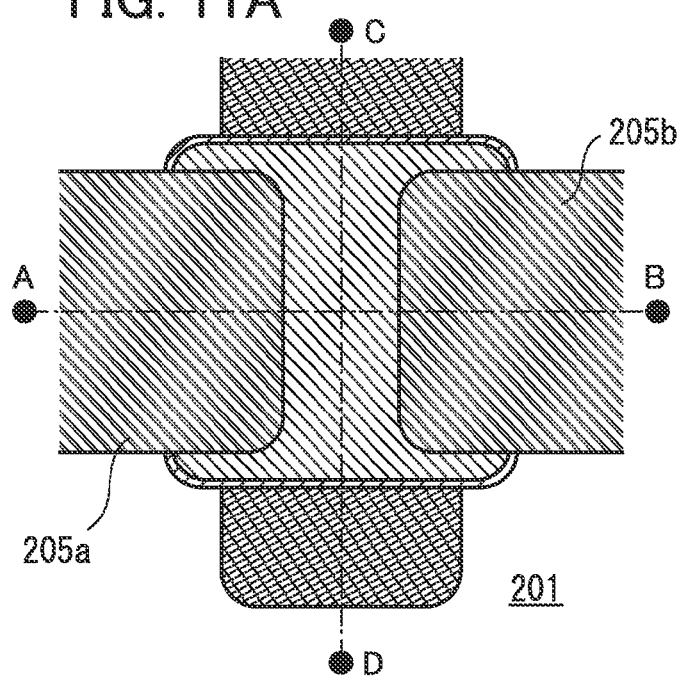
FIGS. 11A to 11C illustrate an example of a manufacturing process of a semiconductor device.
Figure 11B:
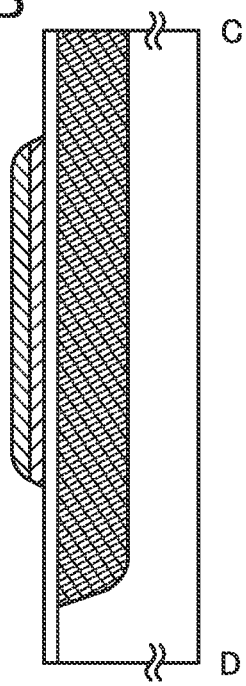
Figure 11C:
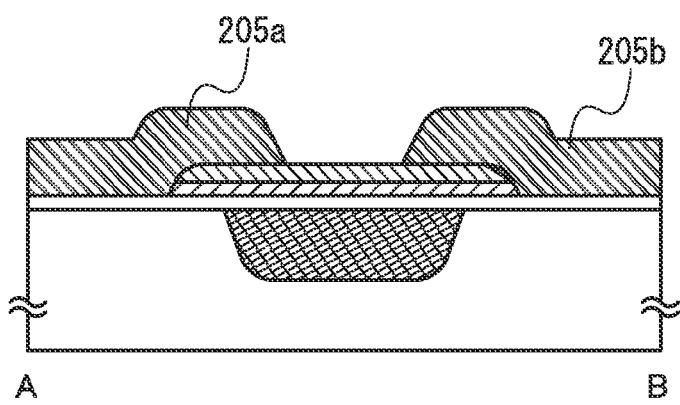

FIGS. 11A to 11C are a top view and cross-sectional views illustrating a state where the source electrode 205a and the drain electrode 205b are further formed. For example, the source electrode 205a and the drain electrode 205b can be formed using a material that can be used for the gate electrode 103 described in Embodiment 1.

Figure 12A:
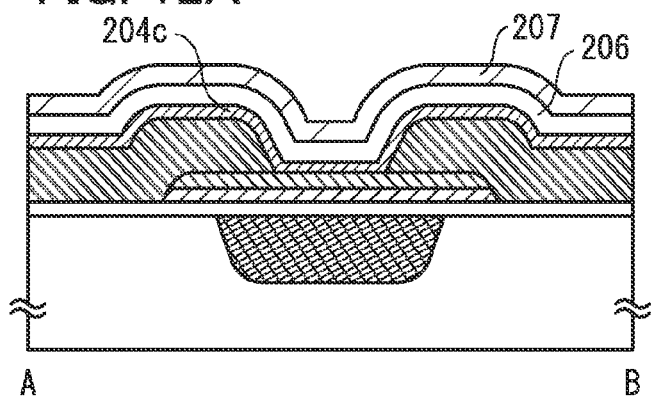
FIGS. 12A to 12C illustrate an example of a manufacturing process of a semiconductor device.

FIG. 12A is a cross-sectional view along the A-B direction illustrating a state where the oxide semiconductor layer 204c, the first insulating layer 206, and the second insulating layer 207 are stacked over the elements illustrated in FIGS. 11A to 11C. For example, the first insulating layer 206 can be formed using a material that can be used for the first insulating layer 102a described in Embodiment 1. The second insulating layer 207 corresponds to the second insulating layer 102b described in Embodiment 1 and is formed using a material including electron trap states. For example, the second insulating layer 207 can be formed using a material that can be used for the second insulating layer 102 described in Embodiment 1. A material of the oxide semiconductor layer 204c is described later.

Note that the oxide semiconductor layer 204c may be shaped so as to exist only within a region of one transistor. For example, the oxide semiconductor layer 204c may be processed into an island shape. The first insulating layer 206 and the second insulating layer 207 may be formed into a film shape.

In the above-described structure, the oxide semiconductor layer 204a, the oxide semiconductor layer 204b, and the oxide semiconductor layer 204c are stacked from the gate insulating layer 203 side in the channel formation region of the transistor.

Here, for the oxide semiconductor layer 204b, for example, an oxide semiconductor whose electron affinity (an energy difference between a vacuum level and the conduction band minimum) is higher than those of the oxide semiconductor layer 204a and the oxide semiconductor layer 204c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layer 204a and the oxide semiconductor layer 204c each contain one or more kinds of metal elements forming the oxide semiconductor layer 204b. For example, the oxide semiconductor layer 204a and the oxide semiconductor layer 204c are formed using an oxide semiconductor whose conduction band minimum is closer to a vacuum level than that of the oxide semiconductor layer 204b by 0.05 eV or more, 0.07 eV or more, 0.1 eV or more, or 0.15 eV or more and 2 eV or less, 1 eV or less, 0.5 eV or less, or 0.4 eV or less.

In such a structure, when a potential is applied to the gate electrode 202, a channel is formed in the oxide semiconductor layer 204b where the conduction band minimum is the lowest. In other words, the oxide semiconductor layer 204a is formed between the oxide semiconductor layer 204b and the gate insulating layer 203, whereby a structure in which the channel of the transistor is provided in a region that is not in contact with the gate insulating layer 203 is obtained.

Further, since the oxide semiconductor layer 204c contains one or more metal elements contained in the oxide semiconductor layer 204b, an interface state is unlikely to be formed at the interface between the oxide semiconductor layer 204b and the oxide semiconductor layer 204c, compared with the interface between the oxide semiconductor layer 204b and the first insulating layer 206 on the assumption that the oxide semiconductor layer 204b is in contact with the first insulating layer 206. The interface state sometimes forms a channel unintentionally, leading to a change in the threshold of the transistor. Thus, with the oxide semiconductor layer 204c, a variation in the electrical characteristics of the transistor, such as threshold, can be reduced. Further, the reliability of the transistor can be improved.

Furthermore, since the oxide semiconductor layer 204a contains one or more metal elements contained in the oxide semiconductor layer 204b, scattering of carriers is unlikely to occur at the interface between the oxide semiconductor layer 204b and the oxide semiconductor layer 204a, compared with the interface between the oxide semiconductor layer 204b and the gate insulating layer 203 on the assumption that the oxide semiconductor layer 204b is in contact with the gate insulating layer 203. Thus, with the oxide semiconductor layer 204a, the field-effect mobility of the transistor can be increased.

For the oxide semiconductor layer 204a and the oxide semiconductor layer 204c, for example, a material containing Al, Ti, Ga, Ge, Y, Zr, Sn, La, Ce, or Hf with a higher atomic ratio than that used for the oxide semiconductor layer 204b can be used. Specifically, an atomic ratio of any of the above metal elements in the oxide semiconductor layer 204a and the oxide semiconductor layer 204c is 1.5 times or more, preferably 2 times or more, further preferably 3 times or more as much as that in the oxide semiconductor layer 204b. Any of the above metal elements is strongly bonded to oxygen and thus has a function of suppressing generation of an oxygen vacancy in the oxide semiconductor layer 204a and the oxide semiconductor layer 204c. That is, an oxygen vacancy is less likely to be generated in the oxide semiconductor layer 204a and the oxide semiconductor layer 204c than in the oxide semiconductor layer 204b.

Note that when each of the oxide semiconductor layer 204a, the oxide semiconductor layer 204b, and the oxide semiconductor layer 204c is an In-M-Zn oxide containing at least indium, zinc, and M (M is a metal such as Al, Ti, Ga, Ge, Y, Zr, Sn, La, Ce, or Hf), and when the oxide semiconductor layer 204a has an atomic ratio of In to M and Zn which is $x_1:y_1:z_1$, the oxide semiconductor layer 204b has an atomic ratio of In to M and Zn which is $x_2:y_2:z_2$, and the oxide semiconductor layer 204c has an atomic ratio of In to M and Zn which is $x_3:y_3:z_3$, $y_1/x_1$ and $y_3/x_3$ is each preferably larger than $y_2/x_2$. $Y_1/x_1$ and $y_3/x_3$ is each 1.5 times or more, preferably 2 times or more, further preferably 3 times or more as large as $y_2/x_2$. At this time, when $y_2$ is greater than or equal to $x_2$ in the oxide semiconductor layer 204b, the transistor can have stable electrical characteristics. However, when $y_2$ is 3 times or more as large as $x_2$, the field-effect mobility of the transistor is reduced; accordingly, $y_2$ is preferably less than 3 times $x_2$.

The ratio of In and M atoms In/M in the oxide semiconductor layer 204a and the oxide semiconductor layer 204c is preferably less than 1, further preferably less than 0.33. In addition, the ratio of In and M atoms In/M in the oxide semiconductor layer 204b is preferably 0.34 or more, further preferably 0.5 or more.

The thicknesses of the oxide semiconductor layer 204a and the oxide semiconductor layer 204c are each greater than or equal to 3 nm and less than or equal to 100 nm, preferably greater than or equal to 3 nm and less than or equal to 50 nm. The thickness of the oxide semiconductor layer 204b is greater than or equal to 3 nm and less than or equal to 200 nm, preferably greater than or equal to 3 nm and less than or equal to 100 nm, further preferably greater than or equal to 3 nm and less than or equal to 50 nm. In addition, the oxide semiconductor layer 204b is preferably thicker than the oxide semiconductor layer 204a and the oxide semiconductor layer 204c.

For the oxide semiconductor layer 204a, the oxide semiconductor layer 204b, and the oxide semiconductor layer 204c, an oxide semiconductor containing indium, zinc, and gallium can be used, for example. Note that the oxide semiconductor layer 204b preferably contains indium because carrier mobility can be increased.

Note that stable electrical characteristics can be effectively imparted to a transistor using an oxide semiconductor layer, by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1 \times 10^{17}/cm^3$, preferably lower than $1 \times 10^{15}/cm^3$, further preferably lower than $1 \times 10^{13}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density. In addition, silicon in the oxide semiconductor layer forms an impurity level. The impurity level might become a trap, so that the electrical characteristics of the transistor might deteriorate. Accordingly, in the oxide semiconductor layer 204a, the oxide semiconductor layer 204b, and the oxide semiconductor layer 204c and at interfaces between these layers, the impurity concentration is preferably reduced.

In order to make the oxide semiconductor layer intrinsic or substantially intrinsic, in secondary ion mass spectrometry (SIMS), for example, the concentration of silicon at a certain depth of the oxide semiconductor layer or in a region of the oxide semiconductor layer is preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. Further, the concentration of hydrogen at a certain depth of the oxide semiconductor layer or in a region of the oxide semiconductor layer is preferably lower than or equal to $2 \times 10^{20}$ atoms/cm$^3$, further preferably lower than or equal to $5 \times 10^{19}$ atoms/cm$^3$, still further preferably lower than or equal to $1 \times 10^{19}$ atoms/cm$^3$, yet still further preferably lower than or equal to $5 \times 10^{18}$ atoms/cm$^3$. Further, the concentration of nitrogen at a certain depth of the oxide semiconductor layer or in a region of the oxide semiconductor layer is preferably lower than $5 \times 10^{19}$ atoms/cm$^3$, further preferably lower than or equal to $5 \times 10^{18}$ atoms/cm$^3$, still further preferably lower than or equal to $1 \times 10^{18}$ atoms/cm$^3$, yet still further preferably lower than or equal to $5 \times 10^{17}$ atoms/cm$^3$.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer may be lower than $1 \times 10^{19}$ atoms/cm$^3$, preferably lower than $5 \times 10^{18}$ atoms/cm$^3$, further preferably lower than $1 \times 10^{18}$ atoms/cm$^3$. Further, the concentration of carbon at a certain depth of the oxide semiconductor layer or in a region of the oxide semiconductor layer may be lower than $1 \times 10^{19}$ atoms/cm$^3$, preferably lower than $5 \times 10^{18}$ atoms/cm$^3$, further preferably lower than $1 \times 10^{18}$ atoms/cm$^3$, for example.

A transistor in which the above-described highly purified oxide semiconductor layer is used for a channel formation region has an extremely low off-state current. In the case where the voltage between a source and a drain is set at about 0.1 V, 5 V, or 10 V, for example, the off-state current standardized on the channel width of the transistor can be as low as several yoctoamperes per micrometer to several zeptoamperes per micrometer.

Note that as the gate insulating layer of the transistor, an insulating layer containing silicon is used in many cases; thus, it is preferable that a region of the semiconductor layer, which serves as a channel, be not in contact with the gate insulating layer for the above-described reason. In the case where a channel is formed at the interface between the gate insulating layer and the multilayer semiconductor layer, scattering of carriers occurs at the interface, whereby the field-effect mobility of the transistor may be reduced. Also from the view of the above, it is preferable that the region of the multilayer semiconductor layer, which serves as a channel, be separated from the gate insulating layer.

Accordingly, with the stacked structure of the oxide semiconductor layers 204a, 204b, and 204c, a channel can be formed in the oxide semiconductor layer 204b; thus, the transistor can have high field-effect mobility and stable electrical characteristics.

Next, the band structure of the stacked structure including the oxide semiconductor layers 204a, 204b, and 204c is described. For analyzing the band structure, In—Ga—Zn oxide with an energy gap of 3.5 eV is used for layers corresponding to the oxide semiconductor layer 204a and the oxide semiconductor layer 204c, and In—Ga—Zn oxide with an energy gap of 3.15 eV is used for a layer corresponding to the oxide semiconductor layer 204b.

The thickness of each of the oxide semiconductor layer 204a, the oxide semiconductor layer 204b, and the oxide semiconductor layer 204c was 10 nm. The energy gap was measured with the use of a spectroscopic ellipsometer (UT-300 manufactured by HORIBA Jobin Yvon). Further, the energy difference between the vacuum level and the valence band maximum was measured using an ultraviolet photoelectron spectroscopy (UPS) device (VersaProbe, ULVAC-PHI. Inc.).

Figure 13A:
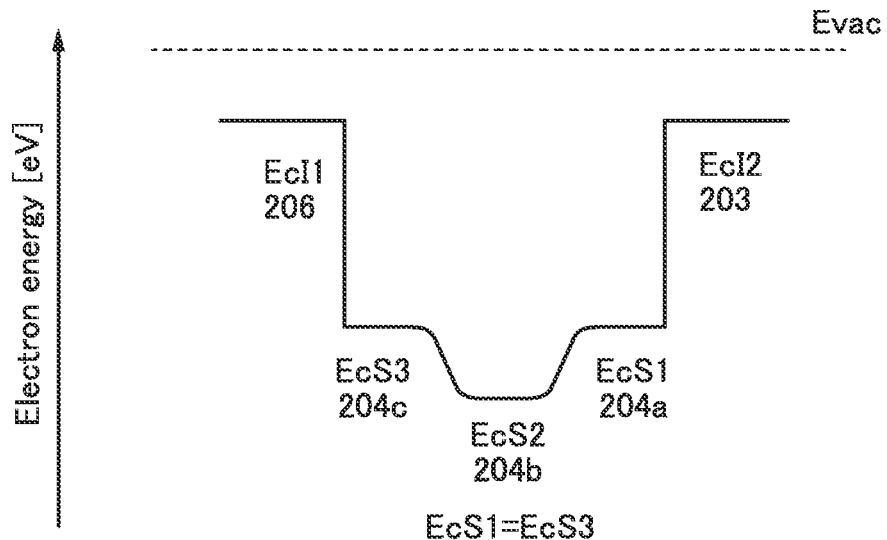
FIGS. 13A and 13B are examples of schematic band diagrams of stacked semiconductor layers.

FIG. 13A is part of a schematic band structure showing an energy difference (electron affinity) between the vacuum level and the conduction band minimum of each layer, which is calculated by subtracting the energy gap from the energy difference between the vacuum level and the valence band maximum. FIG. 13A is a band diagram showing the case where silicon oxide layers are provided in contact with the oxide semiconductor layer 204a and the oxide semiconductor layer 204c. Here, Evac represents energy of the vacuum level. EcI1 and EcI2 each represent the conduction band minimum of the silicon oxide layer, EcS1 represents the conduction band minimum of the oxide semiconductor layer 204a, EcS2 represents the conduction band minimum of the oxide semiconductor layer 204b, and EcS3 represents the conduction band minimum of the oxide semiconductor layer 204c.

As shown in FIG. 13A, the conduction band minimum continuously varies among the oxide semiconductor layer 204a, the oxide semiconductor layer 204b, and the oxide semiconductor layer 204c. This can be understood also from the fact that the constituent elements are common among the oxide semiconductor layer 204a, the oxide semiconductor layer 204b, and the oxide semiconductor layer 204c and oxygen is easily diffused among the oxide semiconductor layers 204a to 204c. Accordingly, the oxide semiconductor layer 204a, the oxide semiconductor layer 204b, and the oxide semiconductor layer 204c have a continuous physical property although they have different compositions in a stack.

The oxide semiconductor layers 204a, 204b, and 204c that are stacked and contain the same main components have not only a simple stacked-layer structure of the layers but also a continuous energy band (here, in particular, a well structure having a U shape in which the conduction band minimum continuously varies among the layers (U-shape well)). In other words, the stacked-layer structure is formed such that there exist no impurities that form a defect level such as a career trap center or a recombination center at each interface. If impurities exist between the stacked layers in the multilayer semiconductor layer, the continuity of the energy band is lost and carriers at the interface disappear by a trap or recombination.

Figure 13B:
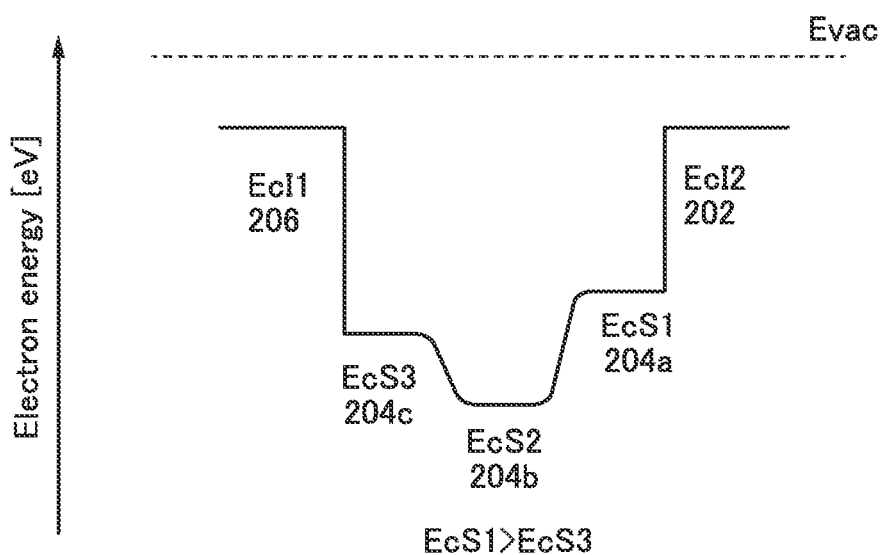

Note that FIG. 13A shows the case where EcS1 and EcS3 are equal to each other; however. EcS1 and EcS3 may be different from each other. For example, part of the band structure in the case where EcS1 is higher than EcS3 is shown in FIG. 13B.

For example, when EcS1 is equal to EcS3, an In—Ga—Zn oxide whose atomic ratio of In to Ga and Zn is 1:3:2, 1:3:3, 1:3:4, 1:4:4, 1:6:4, or 1:9:6 can be used for the oxide semiconductor layer 204a and the oxide semiconductor layer 204c and an In—Ga—Zn oxide whose atomic ratio of In to Ga and Zn is 1:1:1 or 3:1:2 can be used for the oxide semiconductor layer 204b. Further, when EcS1 is higher than EcS3, an In—Ga—Zn oxide whose atomic ratio of In to Ga and Zn is 1:6:4 or 1:9:6 can be used for the oxide semiconductor layer 204a, an In—Ga—Zn oxide whose atomic ratio of In to Ga and Zn is 1:1:1 or 3:1:2 can be used for the oxide semiconductor layer 204b, and an In—Ga—Zn oxide whose atomic ratio of In to Ga and Zn is 1:3:2, 1:3:3, or 1:3:4 can be used for the oxide semiconductor layer 204c, for example.

An oxide that can be used for each of the oxide semiconductor layers 204a, 204b, and 204c preferably contains at least indium (In) or zinc (Zn). Both In and Zn are preferably contained. Furthermore, in order to reduce variations in electrical characteristics of the transistors including the oxide, the oxide preferably contains a stabilizer in addition to In and Zn.

As a stabilizer, gallium (Ga), tin (Sn), hafnium (Hf), aluminum (Al), zirconium (Zr), and the like are used. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, In—Zn oxide, Sn—Zn oxide, Al—Zn oxide, Zn—Mg oxide, Sn—Mg oxide, In—Mg oxide, In—Ga oxide, In—Ga—Zn oxide, In—Al—Zn oxide, In—Sn—Zn oxide, Sn—Ga—Zn oxide, Al—Ga—Zn oxide, Sn—Al—Zn oxide, In—Hf—Zn oxide, In—La—Zn oxide, In—Ce—Zn oxide, In—Pr—Zn oxide, In—Nd—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide. In—Yb—Zn oxide, In—Lu—Zn oxide, In—Sn—Ga—Zn oxide, In—Hf—Ga—Zn oxide, In—Al—Ga—Zn oxide, In—Sn—Al—Zn oxide, In—Sn—Hf—Zn oxide, or In—Hf—Al—Zn oxide.

For example, "In—Ga—Zn oxide" means an oxide containing In, Ga, and Zn as its main components. The In—Ga—Zn oxide may contain another metal element in addition to In, Ga, and Zn. Note that in this specification, a layer containing the In—Ga—Zn oxide is also referred to as an IGZO layer.

A material represented by $InMO_3(ZnO)_m$ (m>0 is satisfied, and m is not an integer) may be used. Note that M represents one or more metal elements selected from Ga, Fe, Mn, or Co. A material represented by $In_2SnO_5(ZnO)_n$ (n>0, n is an integer) may be used.

Note that materials are selected so that the oxide semiconductor layers 204a and 204c each have an electron affinity lower than that of the oxide semiconductor layer 204b.

Note that the oxide semiconductor layer is preferably formed by a sputtering method. As a sputtering method, an RF sputtering method, a DC sputtering method, an AC sputtering method, or the like can be used. In particular, a DC sputtering method is preferably used because dust generated in the film formation can be reduced and the thickness can be uniform.

According to FIGS. 13A and 13B, the oxide semiconductor layer 204b serves as a well, so that a channel is formed in the oxide semiconductor layer 204b. A channel formed to have such a structure can also be referred to as a buried channel.

Note that trap levels due to impurities or defects might be formed in the vicinity of the interface between the oxide semiconductor layer 204a and an insulator such as silicon oxide and between the oxide semiconductor layer 204c and an insulator such as silicon oxide. The oxide semiconductor layer 204b can be distanced away from the trap states owing to existence of the oxide semiconductor layer 204a and the oxide semiconductor layer 204c. However, when the energy differences between EcS2 and EcS1 and between EcS2 and EcS3 are small, an electron in the oxide semiconductor layer 204b might reach the trap states by passing over the energy differences. When the electron is trapped in the trap states, negative fixed charges are generated at the interface with the insulating layers, whereby the threshold of the transistor shifts in the positive direction.

Thus, to reduce a variation in the threshold of the transistor, energy differences between EcS2 and each of EcS1 and EcS3 are necessary. Each of the energy differences is preferably greater than or equal to 0.1 eV, further preferably greater than or equal to 0.15 eV.

The oxide semiconductor layer 204a, the oxide semiconductor layer 204b, and the oxide semiconductor layer 204c preferably include crystal parts. In particular, when a crystal in which c-axes are aligned is used, the transistor can have stable electrical characteristics.

In the case where an In—Ga—Zn oxide is used for the oxide semiconductor layers 204a, 204b, and 204c, it is preferable that the oxide semiconductor layer 204a contain less In than the oxide semiconductor layer 204b so that diffusion of In to the gate insulating layer is prevented.

For the source electrode 205a and the drain electrode 205b, a conductive material that is easily bonded to oxygen is preferably used. For example, Al, Cr, Cu, Ta, Ti, Mo, or W can be used. Among the materials, in particular, it is preferable to use Ti which is easily bonded to oxygen or to use W with a high melting point, which allows subsequent process temperatures to be relatively high. Note that the conductive material that is easily bonded to oxygen includes, in its category, a material to which oxygen is easily diffused.

When the conductive material that is easily bonded to oxygen is in contact with a multilayer semiconductor layer, a phenomenon occurs in which oxygen in the multilayer semiconductor layer is diffused to the conductive material that is easily bonded to oxygen. The phenomenon noticeably occurs when the temperature is high. Since the fabricating process of the transistor involves some heat treatment steps, the above phenomenon causes generation of oxygen vacancies in the vicinity of a region which is in the multilayer semiconductor layer and is in contact with the source electrode or the drain electrode. The oxygen vacancies bond to hydrogen that is slightly contained in the layer, whereby the region is changed to an n-type region. Thus, the n-type region can serve as a source or a drain of the transistor.

In the case of forming a transistor with an extremely short channel length, an n-type region which is formed by the generation of oxygen vacancies might extend in the channel length direction of the transistor, causing a short circuit. In that case, the electrical characteristics of the transistor change; for example, the threshold shifts to cause a state in which on and off states of the transistor cannot be controlled with the gate voltage (conduction state). Accordingly, when a transistor with an extremely short channel length is formed, it is not always preferable that a conductive material that is easily bonded to oxygen be used for a source electrode and a drain electrode.

In such a case, a conductive material which is less likely to be bonded to oxygen than the above material is preferably used for the source electrode 205a and the drain electrode 205b. As the conductive material which is less likely to be bonded to oxygen, for example, a material containing tantalum nitride, titanium nitride, or ruthenium or the like can be used. Note that in the case where the conductive material is in contact with the oxide semiconductor layer 204b, the conductive material which is less likely to be bonded to oxygen and the above-described conductive material that is easily bonded to oxygen may be stacked.

High integration of a semiconductor device requires miniaturization of a transistor. However, it is known that miniaturization of a transistor causes deterioration of electrical characteristics of the transistor. A decrease in channel width causes a reduction in on-state current.

In contrast, in the above-described transistor, as described above, a channel formation region (channel formation layer) of the oxide semiconductor layer 204b is not in contact with the gate insulating layer 203. Accordingly, scattering of carriers at the interface between the channel formation layer and the gate insulating layer can be reduced and the on-state current of the transistor can be increased.

In the above-described transistor, the oxide semiconductor layer 204b is formed over the oxide semiconductor layer 204a, so that an interface state is less likely to be formed. In addition, impurities do not enter the oxide semiconductor layer 204b from above and below because the oxide semiconductor layer 204b is an intermediate layer in a three-layer structure. Accordingly, on-state current of the transistor is increased as described above, and in addition, threshold voltage can be stabilized and an S value can be reduced. Thus, Icut can be reduced and power consumption can be reduced. Furthermore, the threshold of the transistor becomes stable; thus, long-term reliability of the semiconductor device can be improved.

Here, a structure of an oxide semiconductor will be described. In this specification, a term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°. In this specification, trigonal and rhombohedral crystal systems are included in a hexagonal crystal system.

An oxide semiconductor is classified roughly into a non-single-crystal oxide semiconductor and a single crystal oxide semiconductor. The non-single-crystal oxide semiconductor includes any of a c-axis aligned crystalline oxide semiconductor (CAAC-OS), a polycrystalline oxide semiconductor, a microcrystalline oxide semiconductor, an amorphous oxide semiconductor, and the like.

First of all, a CAAC-OS is described.

The CAAC-OS is an oxide semiconductor layer including a plurality of crystal parts. Most of the crystal parts each fit inside a cube whose one side is less than 100 nm. Thus, the CAAC-OS may include a crystal part that fits inside a cube whose one side is less than 10 nm, less than 5 nm, or less than 3 nm.

In a transmission electron microscope (TEM) image of the CAAC-OS, a boundary between crystal pans, that is, a grain boundary is not clearly observed. Thus, in the CAAC-OS, a reduction in electron mobility due to the grain boundary is unlikely to occur.

In the TEM image of the CAAC-OS observed in a direction substantially parallel to a sample surface (cross-sectional TEM image), metal atoms are arranged in a layered manner in the crystal parts. Each metal atom layer has a morphology reflecting a surface over which a layer of the CAAC-OS is formed (hereinafter, a surface over which the layer of the CAAC-OS is formed is referred to as a formation surface) or a top surface of the layer of the CAAC-OS, and is arranged in parallel to the formation surface or the top surface of the CAAC-OS.

In the TEM image of the CAAC-OS observed in a direction substantially perpendicular to the sample surface (plan TEM image), metal atoms are arranged in a triangular or hexagonal configuration in the crystal parts. However, there is no regularity in arrangement of metal atoms between different crystal parts.

From the cross-sectional TEM image and the plan TEM image, orientation characteristics are found in the crystal parts in the CAAC-OS.

A CAAC-OS is subjected to structural analysis with an X-ray diffraction (XRD) apparatus. For example, when the CAAC-OS including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

When the CAAC-OS is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Analysis ($\phi$ scan) is performed under conditions where the sample is rotated around a normal vector of the sample surface as an axis ($\phi$ axis) with $2\theta$ fixed at around 56°. When the sample is a single-crystal oxide semiconductor layer of $InGaZnO_4$, six peaks appear. The six peaks are derived from crystal planes equivalent to the (110) plane. In contrast, when the sample is the CAAC-OS, a peak is not clearly observed.

The above results mean that in the CAAC-OS having c-axis alignment, the directions of a-axes and b-axes are different between crystal parts, but the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS or is formed through crystallization treatment such as heat treatment. As described above, the c-axis of the crystal is oriented in a direction parallel to a normal vector of a formation surface or a normal vector of a top surface. Thus, for example, when the shape of the CAAC-OS is changed by etching or the like, the c-axis might not be necessarily parallel to a normal vector of a formation surface or a normal vector of a top surface of the CAAC-OS.

Furthermore, the degree of crystallinity in the CAAC-OS is not necessarily uniform. For example, if crystal growth leading to the CAAC-OS occurs from the vicinity of the top surface of the CAAC-OS, the degree of the crystallinity in the vicinity of the top surface may be higher than that in the vicinity of the formation surface. Moreover, when an impurity is added to the CAAC-OS, the crystallinity in a region to which the impurity is added is changed, and the degree of crystallinity in the CAAC-OS varies depending on regions.

Note that when the CAAC-OS with an $InGaZnO_4$ crystal is analyzed by an out-of-plane method, a peak of $2\theta$ may be observed at around 36°, in addition to the peak of $2\theta$ at around 31°. The peak of $2\theta$ at around 36° indicates that a crystal having no c-axis alignment is included in part of the CAAC-OS. It is preferable that a peak of $2\theta$ appears at around 31° and a peak of $2\theta$ does not appear at around 36°.

The CAAC-OS is an oxide semiconductor layer having low impurity concentration. The impurity is an element other than the main components of the oxide semiconductor layer, such as hydrogen, carbon, silicon, or a transition metal element. In particular, an element that has higher bonding strength to oxygen than a metal element included in the oxide semiconductor layer, such as silicon, disturbs the atomic arrangement of the oxide semiconductor layer by depriving the oxide semiconductor layer of oxygen and causes a decrease in crystallinity. A heavy metal such as iron or nickel, argon, carbon dioxide, or the like has a large atomic radius (molecular radius), and thus disturbs the atomic arrangement of the oxide semiconductor layer and causes a decrease in crystallinity if contained in the oxide semiconductor layer. Note that the impurity contained in the oxide semiconductor layer might serve as a carrier trap center or a carrier generation source.

The CAAC-OS is an oxide semiconductor layer having a low density of defect states. Oxygen vacancies in the oxide semiconductor layer may serve as carrier trap centers or carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus can have a low carrier density. Thus, a transistor including the oxide semiconductor rarely has negative threshold (is rarely normally on). The highly purified intrinsic or substantially highly purified intrinsic oxide semiconductor has few carrier trap centers. Accordingly, the transistor including the oxide semiconductor has little variation in electrical characteristics and high reliability. Electric charge trapped by the carrier trap centers in the oxide semiconductor takes a long time to be released, and thus may behave like fixed electric charge. Accordingly, the transistor which includes the oxide semiconductor having high impurity concentration and a high density of defect states can have unstable electrical characteristics.

In a transistor using the CAAC-OS, change in electrical characteristics due to irradiation with visible light or ultraviolet light is small.

Next, a microcrystalline oxide semiconductor will be described.

In a TEM image, crystal parts cannot be found clearly in the microcrystalline oxide semiconductor in some cases. In most cases, the size of a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor including nanocrystal is referred to as an nc-OS (nanocrystalline oxide semiconductor). In a TEM image of the nc-OS, for example, a crystal grain boundary cannot clearly found in some cases.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS. Thus, the orientation of the whole layer is not observed. Accordingly, the nc-OS sometimes cannot be distinguished from an amorphous oxide semiconductor depending on an analysis method. For example, when the nc-OS is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS obtained by using an electron beam having a probe diameter (e.g., greater than or equal to 50 nm) larger than the diameter of a crystal part. Meanwhile, spots are shown in a nanobeam electron diffraction pattern of the nc-OS obtained by using an electron beam having a probe diameter (e.g., greater than or equal to 1 nm and smaller than or equal to 30 nm) close to, or smaller than or equal to a diameter of a crystal part. In a nanobeam electron diffraction pattern of the nc-OS, regions with high luminance in a circular (ring) pattern may be shown, and a plurality of spots may be shown in the ring-like region.

The nc-OS is an oxide semiconductor layer that has high regularity as compared with an amorphous oxide semiconductor. For this reason, the nc-OS has a lower density of defect states than an amorphous oxide semiconductor. However, there is no regularity of crystal orientation between different crystal parts in the nc-OS; hence, the nc-OS has a higher density of defect states than the CAAC-OS.

Note that an oxide semiconductor may include two or more kinds selected from an amorphous oxide semiconductor, a microcrystalline oxide semiconductor, and a CAAC-OS, for example.

For example, the CAAC-OS can be deposited by a sputtering method using a polycrystalline oxide semiconductor sputtering target. When ions collide with the sputtering target, a crystal region included in the sputtering target is sometimes separated from the target along an a-b plane; in other words, a sputtered particle having a plane parallel to an a-b plane (flat-plate-like sputtered particle or pellet-like sputtered particle) flakes off from the sputtering target. The f sputtered particle is electrically charged and thus reaches the substrate while maintaining its crystal state, without being aggregation in plasma, forming a CAAC-OS.

First heat treatment may be performed after the oxide semiconductor layer 204b is formed. The first heat treatment may be performed at a temperature higher than or equal to 250° C. and lower than or equal to 650° C., typically higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor layer 204b can be improved, and in addition, impurities such as hydrogen and water can be removed from the oxide semiconductor layer 204a. Note that the first heat treatment may be performed before the etching step for formation of the oxide semiconductor layer 204b.

Note that second heat treatment may be performed after the oxide semiconductor layer 204c is formed. The second heat treatment can be performed under conditions similar to those of the first heat treatment. The second heat treatment can remove impurities such as hydrogen and water from the oxide semiconductor layer 204c. In addition, impurities such as hydrogen and water can be further removed from the oxide semiconductor layers 204a and 204b.

Figure 12B:
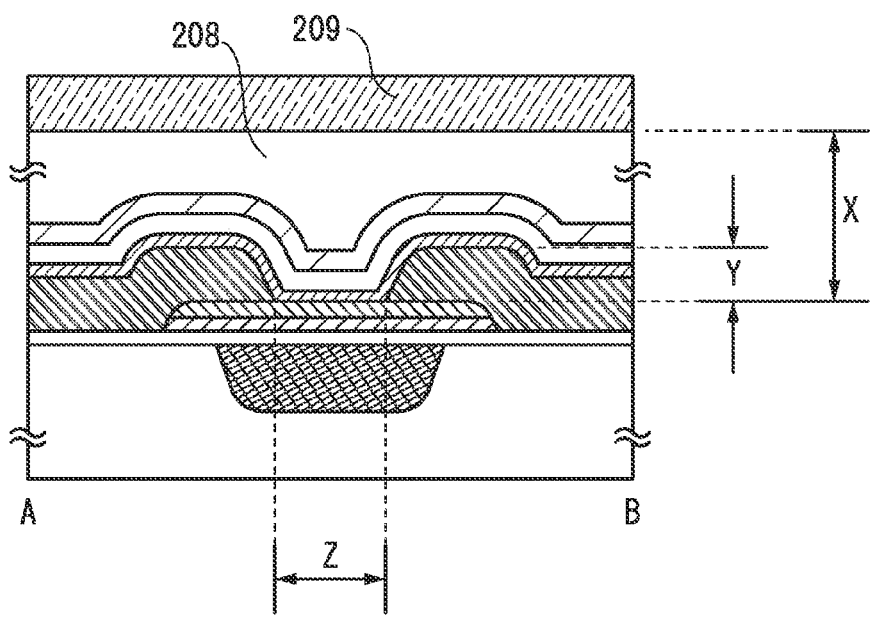

FIG. 12B is a cross-sectional view along the A-B direction illustrating a state where the third insulating layer 208 and a threshold correction electrode 209 are stacked over the elements illustrated in FIG. 12A. For example, the third insulating layer 208 can be formed using a material that can be used for the third insulating layer 102c described in Embodiment 1 or any of a variety of inorganic and organic materials. The third insulating layer 102c may be formed of a plurality of insulating layers and, for example, a stacked structure including an insulating layer of an inorganic material and an insulating layer of an organic material. In the semiconductor device illustrated in FIG. 12B, the first insulating layer 206, the second insulating layer 207, and the third insulating layer 208 correspond respectively, for example, to the first insulating layer 102a, the second insulating layer 102b, and the third insulating layer 102c of Embodiment 1 and illustrated in FIG. 1C. However, the first, second and third insulating layers 206, 207, and 208 may be replaced with any of the structures forming the charge trap layer 102 described in Embodiment 1.

For example, the threshold correction electrode 209 can be formed using a material that can be used for the gate electrode 103 described in Embodiment 1. For example, the third insulating layer 208 has a planarized surface. The third insulating layer 208 may be formed into a film shape.

Here, for example, a distance X between the oxide semiconductor layer 204b and the threshold correction electrode 209 is more than or equal to twice a distance Y between an upper surface of the oxide semiconductor layer 204b and an upper surface of the source electrode 205a (or the drain electrode 205b). Furthermore, for example, a distance Z between the source electrode 205a and the drain electrode 205b is more than or equal to twice the distance Y. Although the distances are not limited to these conditions, charges can be stably trapped when these conditions are satisfied.

In the transistor having such a structure, by application of an appropriate potential difference between the source electrode 205a (or the drain electrode 205b) and the threshold correction electrode 209, electrons are trapped in the second insulating layer 207.

Figure 14A:
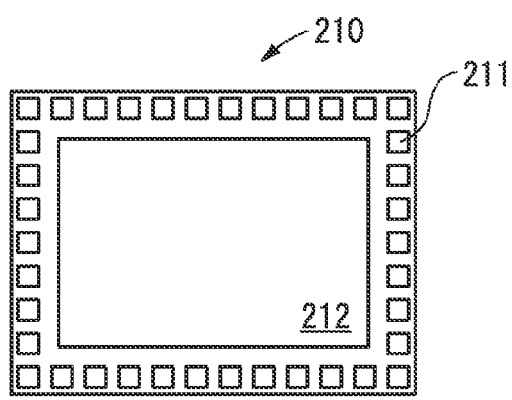
FIGS. 14A to 14D illustrate an example of a semiconductor device.
Figure 14B:
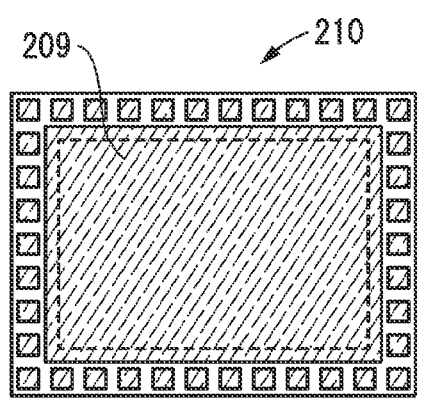

For example, a semiconductor device (a semiconductor chip 210) including the above-described transistor includes a plurality of pads 211 and a device region 212 as illustrated in FIG. 14A. In the device region 212, the above-described transistor is provided. Then, a top surface of the device region 212 is covered with the threshold correction electrode 209 as illustrated in FIG. 14B. Note that top surfaces of the pads 211 may also be covered with the threshold correction electrode 209.

Figure 14C:
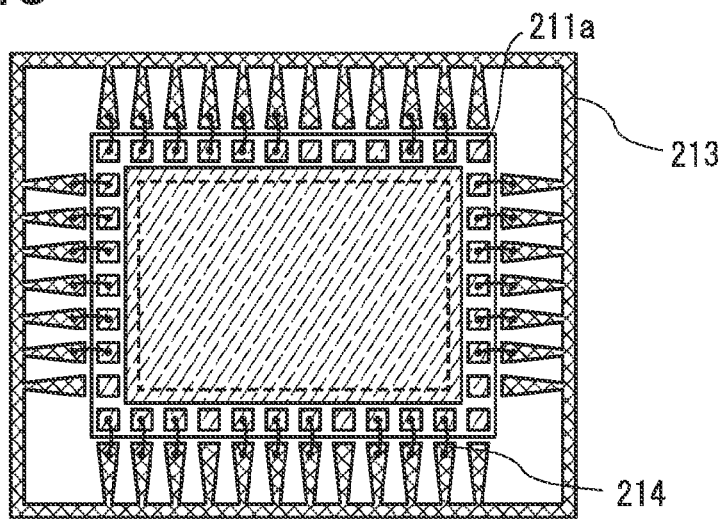

Some or all of the pads 211 of the semiconductor chip 210 are connected to a lead frame 213 with a bonding wire 214 through a wire bonding step as illustrated in FIG. 14C. In the case where the threshold correction electrode 209 is insulated from all the pads connected to the lead frame 213, the potential of the threshold correction electrode 209 is set higher than the potential of the lead frame 213, whereby the threshold adjustment process described in Embodiment 1 can be performed.

Figure 14D:
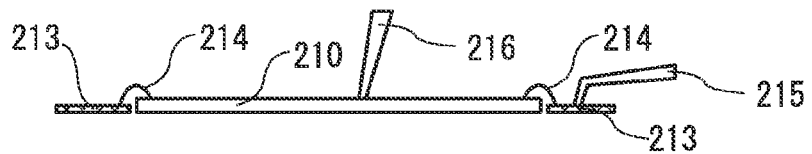

For example, as illustrated in FIG. 14D, a probe 215 and a probe 216 are made in contact with the lead frame 213 and the threshold correction electrode 209 (formed on the semiconductor chip 210), respectively, and the potentials of the probes 215 and 216 are set at potentials appropriate for the threshold adjustment process.

Alternatively, if there is fine electrical connection between some of the pads 211 that are not connected to the lead frame 213 (e.g., a pad 211a) and the threshold correction electrode 209, the probe 216 may be made in contact with the pad 211a.

Figure 12C:
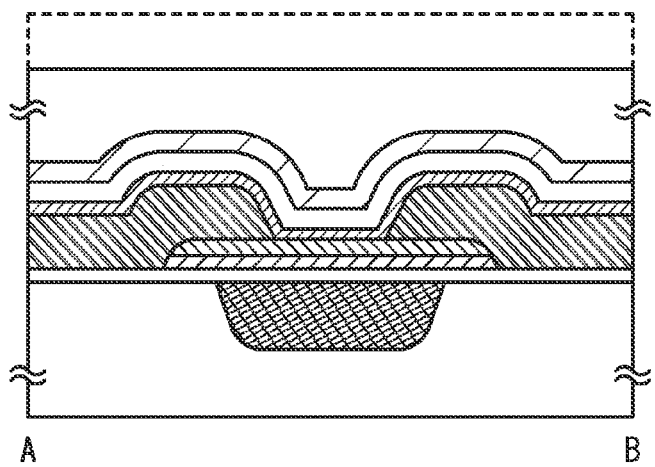

After the threshold adjustment process, the threshold correction electrode 209 may be removed as illustrated in FIG. 12C. Alternatively, for example, a short circuit may be caused between the threshold correction electrode 209 (or the pad 211a) and any of the pads 211 that supply a low potential by wire bonding or the like.

Note that even in the case where the threshold correction electrode 209 is insulated from all the pads connected to the lead frame 213, the connection between the threshold correction electrode 209 and the pads 211 is not necessarily in a completely insulated state. For example, as illustrated in FIG. 15A, a two-terminal element (e.g., an element in which a current is determined by a potential difference, such as a resistor or a forward-connected or reverse-connected diode) may be connected between the threshold correction electrode 209 and a pad 211b.

Figure 15A:
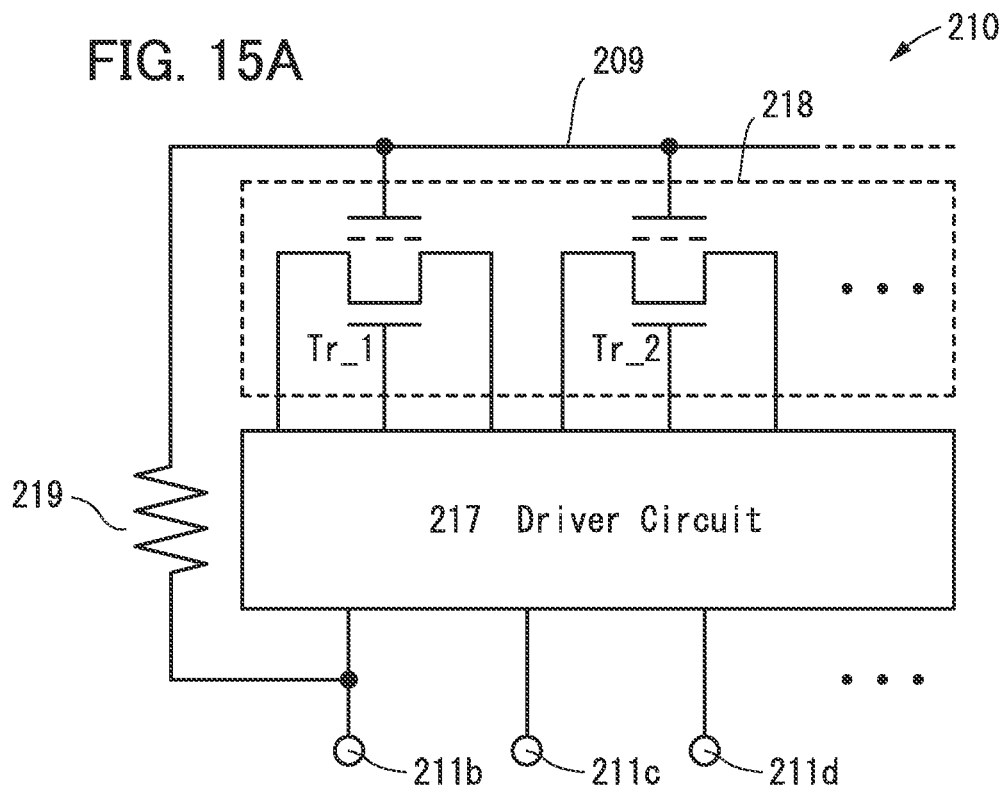
FIGS. 15A and 15B illustrate examples of a semiconductor device.

FIG. 15A schematically illustrates the semiconductor chip 210 illustrated in FIG. 14A and includes a transistor group 218 including a transistor Tr_1 and a transistor Tr_2 and a driver circuit 217 that drives the transistor group 218. A surface of the transistor group 218 is provided with the threshold correction electrode 209.

The driver circuit 217 is provided with the pad 211b, a pad 211c, a pad 211d, and the like. In normal use, power or signals are supplied to a circuit in the semiconductor chip 210 through the pad 211b, the pad 211c, and the pad 211d, and the like. For example, the lowest potential in the circuit is supplied to the pad 211b.

Figure 15B:
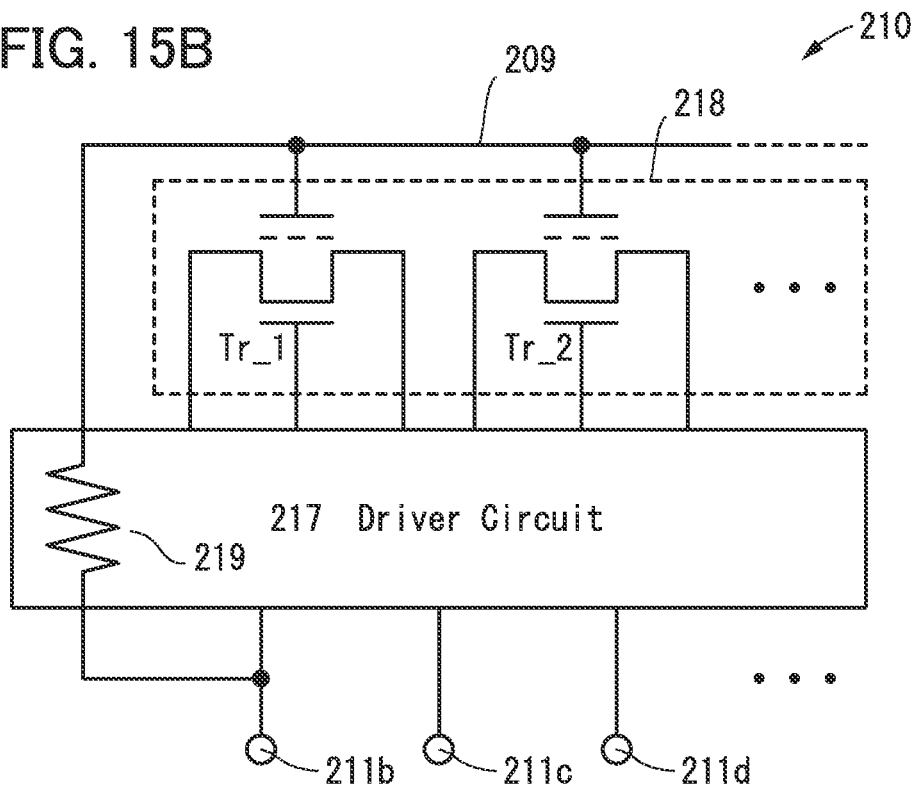

The threshold correction electrode 209 is connected to the pad 211b through a resistor 219. Note that the resistor 219 may be composed of a plurality of resistors connected in parallel and/or in series. For example, the threshold correction electrode 209 may be connected to a low-potential supply line in the device region 212 in the semiconductor chip through a plurality of resistors. In that case, the resistor 219 may be included in the driver circuit 217 as illustrated in FIG. 15B.

In the threshold adjustment process, by setting the potential of the threshold correction electrode 209 higher than the potential of the pad 211b, a current flows through the resistor 219 according to the potential difference between the threshold correction electrode 209 and the pad 211b and the value of the resistor 219 and power is consumed. However, by setting the value of the resistor 219 appropriately, damage of current on the semiconductor chip 210 can be reduced.

Note that during the threshold adjustment process, the same potential is applied to the pad 211b, the pad 211c, and the pad 211d; this situation can be made in the case where these pads are connected to the lead frame 213, for example.

For example, when the potential differences between the threshold correction electrode 209 and the pads 211b, 211c, 211d, and the like are Vx [V] in the threshold adjustment process, the value R [Ω] of the resistor 219 is preferably 0.01 times to 1000 times as high as $Vx^2$.

When Vx is 150 V, the value of the resistor 219 is preferably 225Ω to 22.5 MΩ. The amount of heat generated by the resistor at this time is 1 mW to 100 W. Although depending on the size or the heat radiation property of the resistor 219, the amount of heat generated by the resistor 219 is not in the level that causes unrecoverable damages on the semiconductor chip 210. For example, this generated heat may be utilized for the threshold adjustment process; in this case, the circuit is preferably designed so that the semiconductor chip 210 can be heated as uniformly as possible.

When the resistor 219 having an appropriate value is provided between the threshold correction electrode 209 and the pad 211b in this manner, the threshold correction electrode 209 need not be removed after the threshold adjustment process.

In the case where the threshold correction electrode 209 exists in normal use, the biggest concern is that variations in the potential of the threshold correction electrode 209 vary the (apparent) threshold of the transistors Tr_1 and Tr_2, which is likely to occur, for example, when the threshold correction electrode 209 is in a completely floating state and is insulated from other circuits.

In contrast, when the threshold correction electrode 209 is connected to a circuit in the semiconductor chip 210 through the resistor 219, in order that variations in the potential of the threshold correction electrode 209 cause variations in the threshold of the transistors Tr_1 and Tr_2 and the like to the extent of causing a problem in practical use, a potential difference of 1% or more of the potential difference between the threshold correction electrode 209 and the pad 211b in the threshold adjustment process (1.5 V when the potential difference in the threshold adjustment process is 150 V) needs to be generated in normal use.

For example, if the value of the resistor 219 is 225Ω to 22.5 MΩ, even when charges are injected to the threshold correction electrode 209 by any cause, the charges are immediately eliminated from the threshold correction electrode 209 through the resistor 219; thus, the potential of the threshold correction electrode 209 does not affect the transistors Tr_1 and Tr_2 and the like over a long time of 1 nanosecond or more.

Note that the variations in the threshold at this time (approximately 10 mV) occur in all the transistors in the transistor group 218 equally, and these variations are different phenomena from variations in the threshold among transistors.

This tendency increases as variations in the distance X in FIG. 12B among transistors are smaller, and the variations in the threshold of approximately 10 mV do not cause a practical problem in some cases. That is, when the standard deviation of the distance X of the plurality of transistors is assumed as ΔX, it is preferable that ΔX/X is 0.01 or less. For this purpose, it is preferable that the gate electrode 202 and the third insulating layer 208 have favorable planarity. This can also be applied to the case where the threshold correction electrode 209 is in a completely floating state and is insulated from other circuits.

Although the example of trapping electrons in the second insulating layer 207 has been described so far, holes can be trapped in a similar manner. In addition, although three oxide semiconductor layers 204a, 204b, and 204c are stacked in the above-described example, only two of them or one of them may be used. This embodiment can be combined as appropriate with any of the other embodiments described in this specification.

Embodiment 3

In this embodiment, an example of a cross-sectional structure of a semiconductor device is described with reference to FIG. 16. In the example of this embodiment, the transistor described in Embodiment 1 is stacked over another circuit (e.g., transistors).

Figure 16:
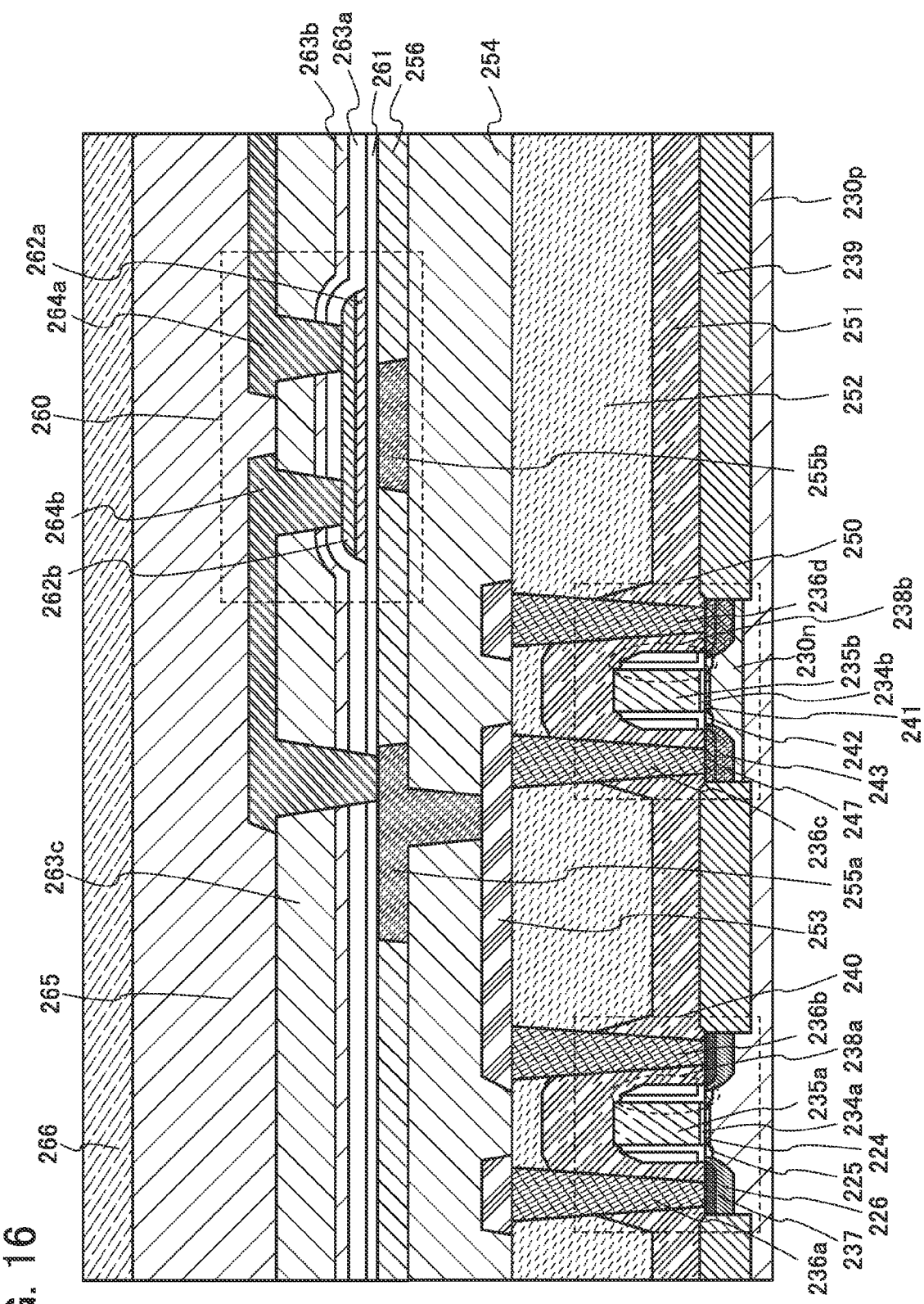
FIG. 16 illustrates an example of a cross section of a semiconductor device.

FIG. 16 illustrates a cross section of part of a semiconductor device. The semiconductor device illustrated in FIG. 16 includes an n-channel transistor and a p-channel transistor each including a first semiconductor material (e.g., silicon) in a lower portion and a transistor including a second semiconductor material (e.g., an oxide semiconductor described in Embodiment 2) in an upper portion.

(Structure of Transistor in Lower Portion)

An n-channel transistor 240 includes a channel formation region 224 provided in a p-type well 230p, low-concentration impurity regions 225 and high-concentration impurity regions 226 (collectively simply referred to as impurity regions) with the channel formation region 224 provided between the impurity regions, conductive regions 237 provided in contact with the impurity regions, a gate insulating layer 234a provided over the channel formation region 224, a gate electrode 235a provided over the gate insulating layer 234a, and a source electrode 236a and a drain electrode 236b provided in contact with the conductive regions 237. Sidewall insulators 238a are provided on side surfaces of the gate electrode 235a. An interlayer insulator 251 and an interlayer insulator 252 are provided to cover the transistor 240. A source electrode 236a and a drain electrode 236b are connected to the conductive regions 237 through openings formed in the interlayer insulators 251 and 252. Note that the conductive regions 237 can be formed of a metal silicide or the like.

A p-channel transistor 250 includes a channel formation region 241 provided in an n-type well 230n, low-concentration impurity regions 242 and high-concentration impurity regions 243 (collectively simply referred to as impurity regions) with the channel formation region 241 provided between the impurity regions, conductive regions 247 provided in contact with the impurity regions, a gate insulating layer 234b provided over the channel formation region 241, a gate electrode 235b provided over the gate insulating layer 234b, and a source electrode 236c and a drain electrode 236d provided in contact with the conductive regions 247. Sidewall insulators 238b are provided on side surfaces of the gate electrode 235b. The interlayer insulator 251 and the interlayer insulator 252 are provided to cover the transistor 250. The source electrode 236c and the drain electrode 236d are connected to the conductive regions 247 through openings formed in the interlayer insulators 251 and 252.

Furthermore, element separation insulators 239 are provided to surround each of the transistors 240 and 250.

Although FIG. 16 illustrates the case where a triple-well structure is employed, a double-well structure, a twin-well structure, or a single-well structure may alternatively be employed. Although the case where the channels of the transistors 240 and 250 are formed in the p-type well 230p and the n-type well 230n formed in a substrate, respectively, is illustrated in FIG. 16, the channels of the transistors 240 and 250 may be formed in an amorphous semiconductor or a polycrystalline semiconductor formed over an insulating surface. Alternatively, the channels may be formed in a single crystal semiconductor, like the case of using an SOI substrate.

When the transistors 240 and 250 are formed using a single crystal semiconductor substrate, the transistors 240 and 250 can operate at high speed and the thresholds thereof can be precisely controlled.

The transistors 240 and 250 are connected to each other through a wiring 253, and an interlayer insulator 254 is provided over the wiring 253. Furthermore, conductive layers 255a and 255b and an insulator 256 are provided over the interlayer insulator 254. The insulator 256 is preferably formed in such a manner that after the conductive layers 255a and 255b are formed over the interlayer insulator 254, an insulator 256 is formed over the conductive layers 255a and 255b and then the insulator 256 is subjected to polishing treatment until upper surfaces of the conductive layers 255a and 255b are exposed.

(Structure of Transistor in Upper Portion)

A transistor 260 in an upper portion is a transistor whose channel is formed in a semiconductor having a wider band gap than silicon. The transistor 260 includes the conductive layer 255b provided over the interlayer insulator 254, a gate insulating layer 261 provided over the conductive layer 255b, a first semiconductor layer 262a and a second semiconductor layer 262b provided over the gate insulating layer 261, insulating layers 263a, 263b, and 263c provided over the first semiconductor layer 262a and the second semiconductor layer 262b, conductive layers 264a and 264b that are provided over the insulating layer 263c and in contact with the second semiconductor layer 262b through contact holes provided in the insulating layers 263a, 263b, and 263c, and an interlayer insulator 265 provided over the insulating layer 263c and the conductive layers 264a and 264b. Note that the conductive layer 255a functions as a gate electrode. A threshold correction electrode 266 is provided over the interlayer insulator 265.

Here, the insulating layer 263b includes electron trap states, and charges (e.g. electrons) can be injected thereto from the second semiconductor layer 262b (or the first semiconductor layer 262a) at an appropriate temperature with an application of an appropriate voltage between the threshold correction electrode 266 and the conductive layer 264a (and/or the conductive layer 264b).

Accordingly, the first semiconductor layer 262a and the second semiconductor layer 262b correspond to, for example, the semiconductor layer 101; the insulating layer 263a, the insulating layer 263b, the insulating layer 263c and the interlayer insulator 265 correspond to, for example, the first insulating layer 102a, the second insulating layer 102b, and the third insulating layer 102c (i.e. the charge trap layer 102); and the threshold correction electrode 266 corresponds to the gate electrode 103 in FIG. 2B.

Here, in order to inject electrons effectively to the insulating layer 263b, the effective distance between the second semiconductor layer 262b and the threshold correction electrode 266 is preferably more than or equal to twice the effective distance (the distance in consideration of the dielectric constant of the insulator) between the conductive layers 264a and 264b or more than or equal to twice the effective height from the point at which the conductive layer 264a (and/or the conductive layer 264b) contacts the second semiconductor layer 262b to an upper surface of the conductive layer 264a and, in addition, less than or equal to 5 times the effective distance between the second semiconductor layer 262b and the insulating layer 263b.

Although the example of trapping electrons in the insulating layer 263b has been described so far, holes can be trapped in a similar manner. This embodiment can be combined as appropriate with any of the other embodiments described in this specification.

Embodiment 4

In this embodiment, a CPU in which at least the transistor described in the above embodiment can be used and the memory device described in the above embodiment is included will be described.

Figure 17:
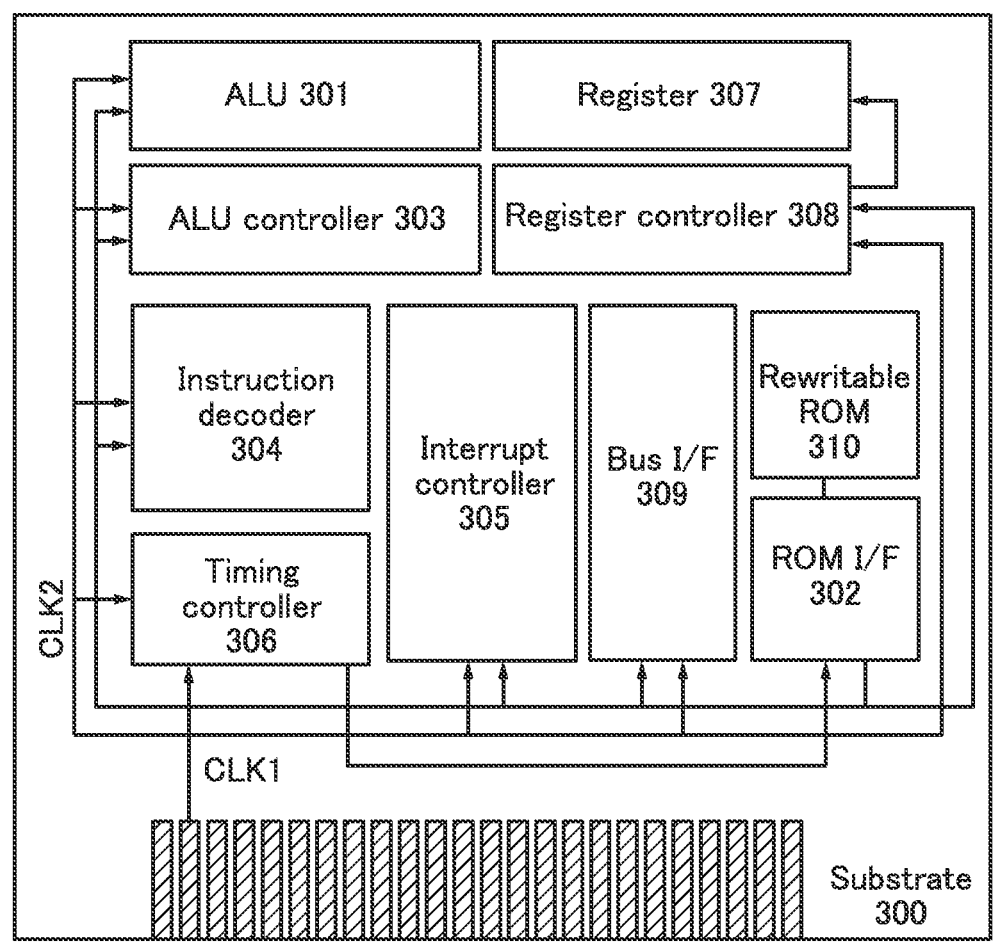
FIG. 17 illustrates an example of a block diagram of a semiconductor device of an embodiment.

FIG. 17 is a block diagram illustrating a configuration example of a CPU at least partly including the transistor described in Embodiment 2.

The CPU illustrated in FIG. 17 includes an arithmetic logic unit (ALU) 301, an ALU controller 303, an instruction decoder 304, an interrupt controller 305, a timing controller 306, a register 307, a register controller 308, a bus interface (Bus I/F) 309, a rewritable ROM 310, and an ROM interface (ROM I/F) 302 over a substrate 300. A semiconductor substrate, an SOI substrate, a glass substrate, or the like is used as the substrate 300. The rewritable ROM 310 and the ROM interface 302 may be provided over a separate chip. Obviously, the CPU illustrated in FIG. 17 is only an example with a simplified structure, and a variety of structures is used for an actual CPU depending on uses. For example, the CPU may have the following configuration: a structure including the CPU illustrated in FIG. 17 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 309 is input to the instruction decoder 304 and decoded therein, and then, input to the ALU controller 303, the interrupt controller 305, the register controller 308, and the timing controller 306.

The ALU controller 303, the interrupt controller 305, the register controller 308, and the timing controller 306 conduct various controls in accordance with the decoded instruction. Specifically, the ALU controller 303 generates signals for controlling the operation of the ALU 301. While the CPU is executing a program, the interrupt controller 305 judges an interrupt request from an external input/output device or a peripheral circuit on the basis of its priority or a mask state, and processes the request. The register controller 308 generates an address of the register 307, and reads/writes data from/to the register 307 in accordance with the state of the CPU.

The timing controller 306 generates signals for controlling operation timings of the ALU 301, the ALU controller 303, the instruction decoder 304, the interrupt controller 305, and the register controller 308. For example, the timing controller 306 includes an internal clock generator for generating an internal clock signal CLK2 based on a reference clock signal CLK1, and supplies the internal clock signal CLK2 to the above circuits.

In the CPU illustrated in FIG. 17, a memory cell is provided in the register 307. As the memory cell of the register 307, any of the transistors described in the above embodiments can be used. Alternatively, any of the transistors described in the above embodiments may be used in a cache memory.

In the CPU illustrated in FIG. 17, the register controller 308 selects operation of holding data in the register 307 in accordance with an instruction from the ALU 301. That is, the register controller 308 selects whether data is retained by a flip-flop or by a capacitor in the memory cell included in the register 307. When data retaining by the flip-flop is selected, a power supply voltage is supplied to the memory cell in the register 307. When data holding by the capacitor is selected, the data is rewritten in the capacitor, and supply of power supply voltage to the memory cell in the register 307 can be stopped.

Figure 18:
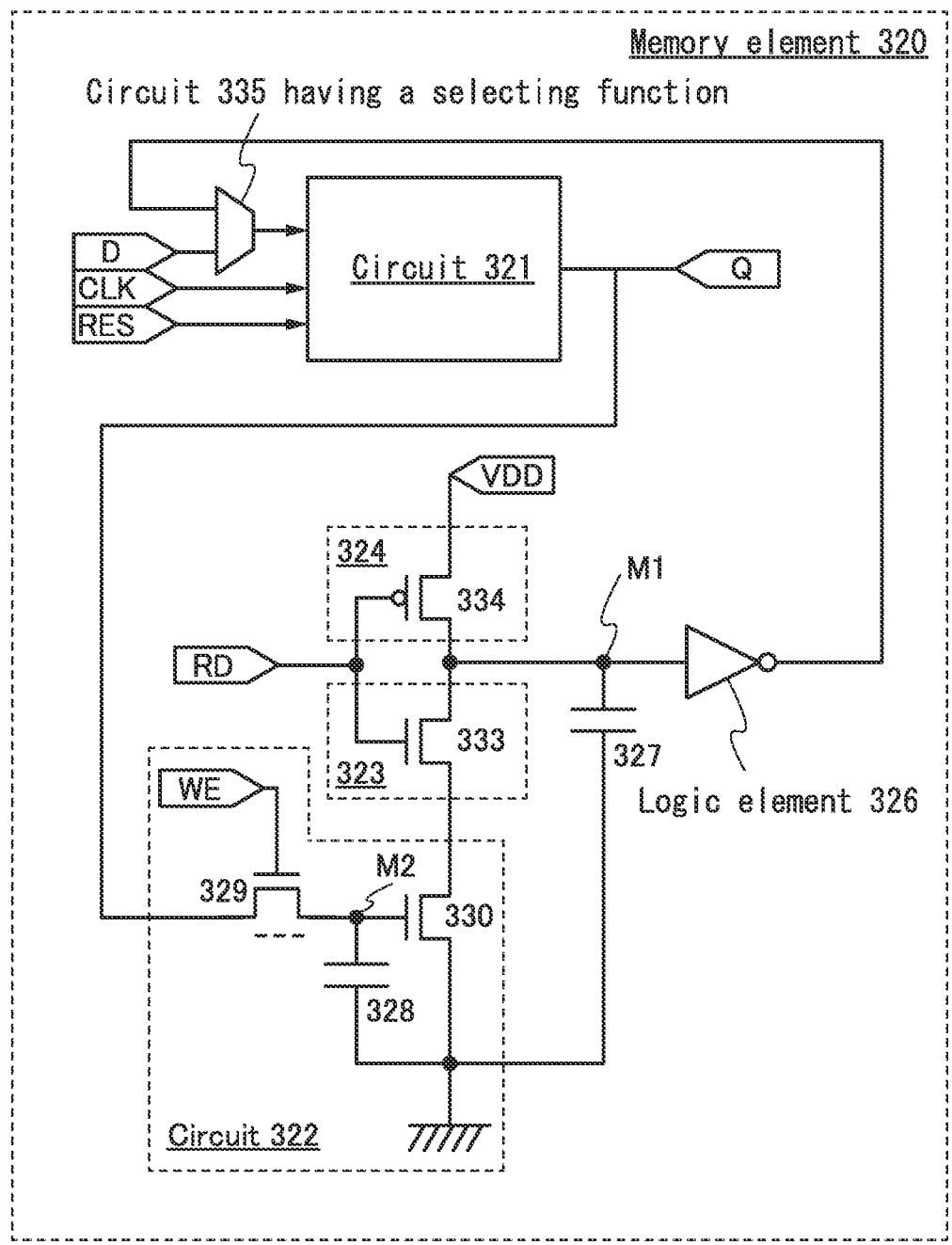
FIG. 18 is a circuit diagram illustrating an example of a memory device of an embodiment.

FIG. 18 is an example of a circuit diagram of a memory element that can be used as the register 307. A memory element 320 includes a circuit 321 in which stored data is volatilized when power supply is stopped, a circuit 322 in which stored data is not volatilized even when power supply is stopped, a switch 323, a switch 324, a logic element 326, a capacitor 327, and a circuit 335 having a selecting function. The circuit 322 includes a capacitor 328, a transistor 329, and a transistor 330. Note that the memory element 320 may further include another element such as a diode, a resistor, or an inductor, as needed.

Here, any of the transistors described in the above embodiments can be used in the circuit 322. When supply of a power supply voltage to the memory element 320 is stopped, a ground potential (GND) is input to both gates (a first gate and a second gate) of the transistor 329 of the circuit 322. For example, the gate of the transistor 329 is grounded through a load such as a resistor. As described in Embodiment 1 for the transistor 110, the transistor 329 has an extremely low Icut because electrons are trapped in the charge trap layer and thereby the threshold is increased; thus, charges stored in the capacitor 328 can be held for a long time.

Shown here is an example in which the switch 323 is a transistor 333 having one conductivity type (e.g., an n-channel transistor) and the switch 324 is a transistor 334 having a conductivity type opposite to the one conductivity type (e.g., a p-channel transistor). A first terminal of the switch 323 corresponds to one of a source and a drain of the transistor 333, a second terminal of the switch 323 corresponds to the other of the source and the drain of the transistor 333, and conduction or non-conduction between the first terminal and the second terminal of the switch 323 (i.e., the on/off state of the transistor 333) is selected by a control signal RD input to a gate of the transistor 333. A first terminal of the switch 324 corresponds to one of a source and a drain of the transistor 334, a second terminal of the switch 324 corresponds to the other of the source and the drain of the transistor 334, and conduction or non-conduction between the first terminal and the second terminal of the switch 324 (i.e., the on/off state of the transistor 334) is selected by the control signal RD input to a gate of the transistor 334.

One of a source and a drain of the transistor 329 is electrically connected to one of a pair of electrodes of the capacitor 328 and a gate of the transistor 330. Here, the connection portion is referred to as a node M2. One of a source and a drain of the transistor 330 is electrically connected to a line which can supply a low power supply potential (e.g., a GND line), and the other thereof is electrically connected to the first terminal of the switch 323 (the one of the source and the drain of the transistor 333). The second terminal of the switch 323 (the other of the source and the drain of the transistor 333) is electrically connected to the first terminal of the switch 324 (the one of the source and the drain of the transistor 334). The second terminal of the switch 324 (the other of the source and the drain of the transistor 334) is electrically connected to a line which can supply a power supply potential VDD. The second terminal of the switch 323 (the other of the source and the drain of the transistor 333), the first terminal of the switch 324 (the one of the source and the drain of the transistor 334), an input terminal of the logic element 326, and one of a pair of electrodes of the capacitor 327 are electrically connected to each other. Here, the connection portion is referred to as a node M1. The other of the pair of electrodes of the capacitor 327 can be supplied with a constant potential. For example, the other of the pair of electrodes of the capacitor 327 can be supplied with a low power supply potential (e.g., GND) or a high power supply potential (e.g., VDD). The other of the pair of electrodes of the capacitor 327 is electrically connected to the line which can supply a low power supply potential (e.g., a GND line). The other of the pair of electrodes of the capacitor 328 can be supplied with a constant potential. For example, the other of the pair of electrodes of the capacitor 328 can be supplied with the low power supply potential (e.g., GND) or the high power supply potential (e.g., VDD). The other of the pair of electrodes of the capacitor 328 is electrically connected to the line which can supply a low power supply potential (e.g., a GND line).

The capacitor 327 and the capacitor 328 are not necessarily provided as long as the parasitic capacitance of the transistor, the wiring, or the like is actively utilized.

A control signal WE is input to the first gate (first gate electrode) of the transistor 329. The potential of the second gate (second gate electrode) of the transistor 329 is kept at GND. As for each of the switch 323 and the switch 324, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 321 is input to the other of the source and the drain of the transistor 329. FIG. 18 illustrates an example in which a signal output from the circuit 321 is input to the other of the source and the drain of the transistor 329. The logic value of a signal output from the second terminal of the switch 323 (the other of the source and the drain of the transistor 333) is inverted by the logic element 326, and the inverted signal is input to the circuit 321 through the circuit 335.

In the example of FIG. 18, a signal output from the second terminal of the switch 323 (the other of the source and the drain of the transistor 333) is input to the circuit 321 through the logic element 326 and the circuit 335; however, this embodiment is not limited thereto. The signal output from the second terminal of the switch 323 (the other of the source and the drain of the transistor 333) may be input to the circuit 321 without its logic value being inverted. For example, in the case where the circuit 321 includes a node in which a signal obtained by inversion of the logic value of a signal input from the input terminal is retained, the signal output from the second terminal of the switch 323 (the other of the source and the drain of the transistor 333) can be input to the node.

The transistor described in Embodiment 2 can be used as the transistor 329 in FIG. 18. The control signal WE and the lowest potential in the circuit (e.g., GND) may be input to the first gate and the second gate, respectively.

In FIG. 18, the transistors included in the memory element 320 except for the transistor 329 can each be a transistor in which a channel is formed in a layer formed using a semiconductor other than an oxide semiconductor or in the substrate 300. For example, a channel of transistor can be formed in a silicon layer or a silicon substrate. Alternatively, all the transistors in the memory element 320 may be a transistor in which a channel is formed in an oxide semiconductor layer. Further alternatively, in the memory element 320, a transistor in which a channel is formed in an oxide semiconductor layer can be included besides the transistor 329, and a transistor in which a channel is formed in a layer or the substrate 300 including a semiconductor other than an oxide semiconductor can be used for the rest of the transistors. Note that in the transistor 329, after the threshold adjustment process, the gate electrode for the threshold adjustment process is removed but electrons remain in the charge trap layer.

As the circuit 321 in FIG. 18, a flip-flop circuit can be used, for example. As the logic element 326, an inverter or a clocked inverter can be used, for example.

In a period during which the memory element 320 is not supplied with the power supply voltage, data stored in the circuit 321 can be retained by the capacitor 328 which is provided in the circuit 322.

The transistor in which a channel is formed in an oxide semiconductor layer holds an appropriate number of electrons in the charge trap layer as a result of the threshold adjustment process and thereby has an appropriately high threshold, leading to an extremely low Icut. For example, the off-state current of a transistor in which a channel is formed in an oxide semiconductor layer is significantly lower than that of a transistor in which a channel is formed in silicon having crystallinity. Thus, when such a transistor including an oxide semiconductor is used for the transistor 329, a signal held in the capacitor 328 is retained for a long time also in a period during which the power supply voltage is not supplied to the memory element 320. The memory element 320 can thus retain the stored content (data) also in a period during which the supply of the power supply voltage is stopped.

The memory element 320 performs pre-charge operation with the switch 323 and the switch 324, shortening the time required for the circuit 321 to retain original data again after the supply of the power supply voltage is restarted.

In the circuit 322, a signal retained by the capacitor 328 is input to the gate of the transistor 330. Therefore, after supply of the power supply voltage to the memory element 320 is restarted, the signal retained by the capacitor 328 can be converted into the one corresponding to the state (the on state or the off state) of the transistor 330 to be read from the circuit 322. Consequently, an original signal can be accurately read even when a potential corresponding to the signal retained by the capacitor 328 varies to some degree.

By using the above-described memory element 320 in a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although an example of using the memory element 320 in a CPU has been described in this embodiment, the memory element 320 can also be used in an LSI such as a digital signal processor (DSP), a custom LSI, or a programmable logic device (PLD), and a radio frequency identification (RF-ID).

This embodiment can be implemented in appropriate combination with any of the other embodiments described in this specification.

Embodiment 5

The semiconductor device described above can be used for display devices, personal computers, image reproducing devices provided with recording media (typically, devices that reproduce the content of recording media such as digital versatile discs (DVDs) and have displays for displaying the reproduced images), or the like. Other examples of electronic devices that can be equipped with the semiconductor device described above are mobile phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 19A to 19F illustrate specific examples of these electronic devices.

Figure 19A:
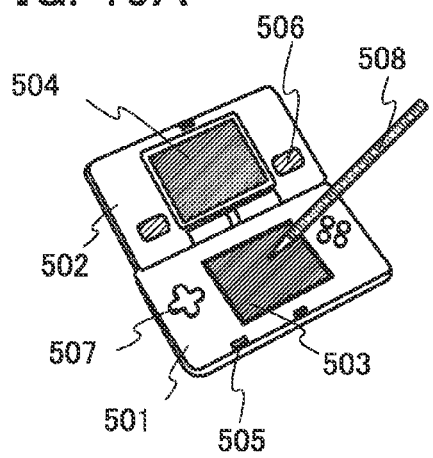
FIGS. 19A to 19F illustrate examples of electronic devices.

FIG. 19A illustrates a portable game machine including a housing 501, a housing 502, a display portion 503, a display portion 504, a microphone 505, a speaker 506, an operation key 507, a stylus 508, and the like. Although the portable game machine in FIG. 19A has the two display portions 503 and 504, the number of display portions included in a portable game machine is not limited to this.

Figure 19B:
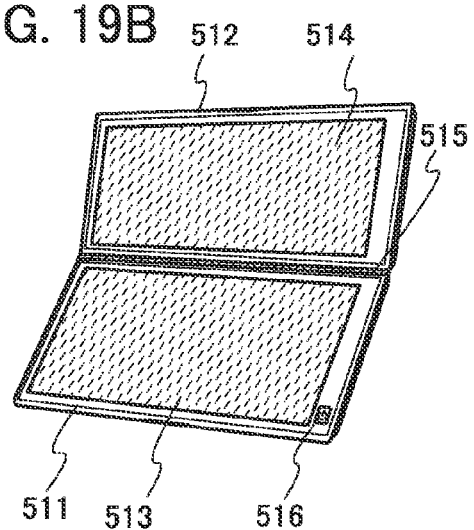

FIG. 19B illustrates a portable data terminal including a first housing 511, a second housing 512, a first display portion 513, a second display portion 514, a joint 515, an operation key 516, and the like. The first display portion 513 is provided in the first housing 511, and the second display portion 514 is provided in the second housing 512. The first housing 511 and the second housing 512 are connected to each other with the joint 515, and the angle between the first housing 511 and the second housing 512 can be changed with the joint 515. An image on the first display portion 513 may be switched depending on the angle between the first housing 511 and the second housing 512 at the joint 515. A display device with a position input function may be used as at least one of the first display portion 513 and the second display portion 514. Note that the position input function can be added by providing a touch panel in a display device. Alternatively, the position input function can be added by provision of a photoelectric conversion element called a photosensor in a pixel area of a display device.

Figure 19C:
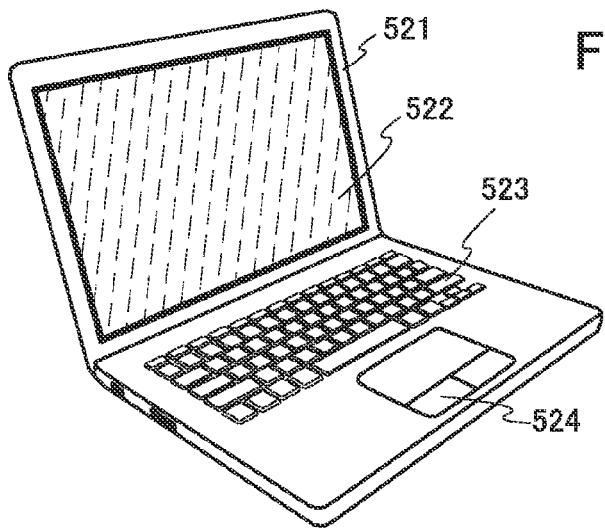

FIG. 19C illustrates a laptop personal computer, which includes a housing 521, a display portion 522, a keyboard 523, a pointing device 524, and the like.

Figure 19D:
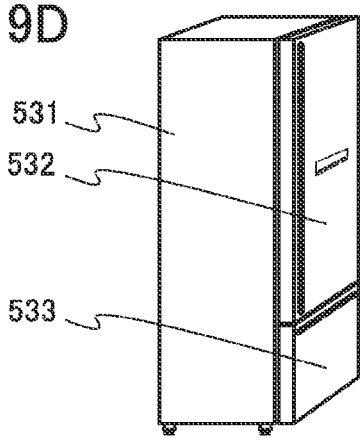

FIG. 19D illustrates the electric refrigerator-freezer including a housing 531, a door for a refrigerator 532, a door for a freezer 533, and the like.

Figure 19E:
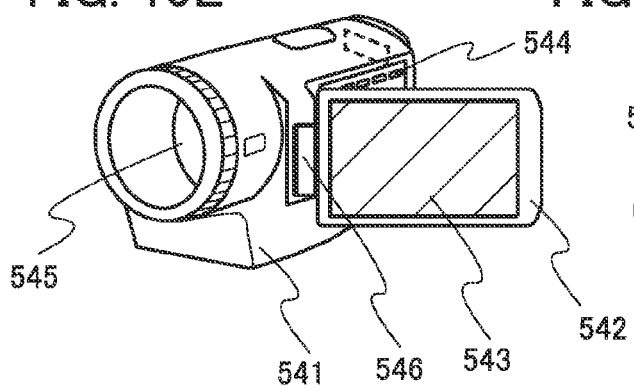

FIG. 19E illustrates a video camera, which includes a first housing 541, a second housing 542, a display portion 543, operation keys 544, a lens 545, a joint 546, and the like. The operation keys 544 and the lens 545 are provided for the first housing 541, and the display portion 543 is provided for the second housing 542. The first housing 541 and the second housing 542 are connected to each other with the joint 546, and the angle between the first housing 541 and the second housing 542 can be changed with the joint 546. Images displayed on the display portion 543 may be switched in accordance with the angle at the joint 546 between the first housing 541 and the second housing 542.

Figure 19F:
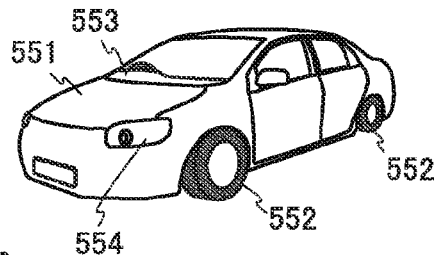

FIG. 19F illustrates a passenger car including a car body 551, wheels 552, a dashboard 553, lights 554, and the like.

This embodiment can be combined as appropriate with any of the other embodiments described in this specification.

This application is based on Japanese Patent Application serial no. 2013-189225 filed with Japan Patent Office on Sep. 12, 2013, the entire contents of which are hereby incorporated by reference.

What is claimed is:
1. A semiconductor device comprising:
a first electrode;
an oxide semiconductor layer over the first electrode;
an insulating layer between the first electrode and the oxide semiconductor layer;
a charge trap layer over the oxide semiconductor layer; and
a second electrode and a third electrode each between the oxide semiconductor layer and the charge trap layer, and in electrical contact with the oxide semiconductor layer,
wherein the charge trap layer includes one of:
a) a charge trap second insulating layer and a charge trap first insulating layer between the charge trap second insulating layer and the oxide semiconductor layer, the charge trap first insulating layer having a wider band gap and a lower electron affinity than the charge trap second insulating layer;
b) a stack comprising, in this order: a charge trap first insulating layer, a charge trap second insulating layer, and a charge trap third insulating layer, the charge trap first insulating layer and the charge trap third insulating layer each having a wider band gap and a lower electron affinity than the charge trap second insulating layer; and
c) a conductive layer included in an insulator.

2. A semiconductor device comprising:
a first electrode;
an oxide semiconductor layer over the first electrode;
a second electrode over the oxide semiconductor layer;
an insulating layer between the first electrode and the oxide semiconductor layer;
a charge trap layer between the oxide semiconductor layer and the second electrode; and
a third electrode and a fourth electrode each between the oxide semiconductor layer and the charge trap layer, and in electrical contact with the oxide semiconductor layer,
wherein the charge trap layer includes one of:
a) a charge trap second insulating layer and a charge trap first insulating layer between the charge trap second insulating layer and the oxide semiconductor layer, the charge trap first insulating layer having a wider band gap and a lower electron affinity than the charge trap second insulating layer;
b) a stack comprising, in this order: a charge trap first insulating layer, a charge trap second insulating layer, and a charge trap third insulating layer, the charge trap first insulating layer and the charge trap third insulating layer each having a wider band gap and a lower electron affinity than the charge trap second insulating layer; and
c) a conductive layer included in an insulator.

3. The semiconductor device according to claim 1, wherein the charge trap layer has a thickness of 500 nm or more.

4. The semiconductor device according to claim 2, wherein the charge trap layer has a thickness of 500 nm or more.

5. The semiconductor device according to claim 1, wherein a distance between an upper surface of the oxide semiconductor layer and an upper surface of the charge trap layer is more than twice a distance between the upper surface of the oxide semiconductor layer and an upper surface of the third electrode.

6. The semiconductor device according to claim 2, wherein a distance between an upper surface of the oxide semiconductor layer and an upper surface of the charge trap layer is more than twice a distance between the upper surface of the oxide semiconductor layer and an upper surface of the third electrode.

7. The semiconductor device according to claim 1, wherein a minimal distance between the third electrode and the fourth electrode is more than twice a distance between an upper surface of the oxide semiconductor layer and an upper surface of the third electrode.

8. The semiconductor device according to claim 2, wherein a minimal distance between the third electrode and the fourth electrode is more than twice a distance between an upper surface of the oxide semiconductor layer and an upper surface of the third electrode.

9. The semiconductor device according to claim 1,
wherein a distance between an upper surface of the oxide semiconductor layer and an upper surface of the charge trap layer is more than twice a distance between the upper surface of the oxide semiconductor layer and an upper surface of the third electrode, and
wherein a minimal distance between the third electrode and the fourth electrode is more than twice the distance between the upper surface of the oxide semiconductor layer and the upper surface of the third electrode.

10. The semiconductor device according to claim 2,
wherein a distance between an upper surface of the oxide semiconductor layer and an upper surface of the charge trap layer is more than twice a distance between the upper surface of the oxide semiconductor layer and an upper surface of the third electrode, and
wherein a minimal distance between the third electrode and the fourth electrode is more than twice the distance between the upper surface of the oxide semiconductor layer and the upper surface of the third electrode.

11. The semiconductor device according to claim 1, wherein the charge trap layer comprises a planarized upper surface.

12. The semiconductor device according to claim 2, wherein the charge trap layer comprises a planarized upper surface.

13. An electronic device equipped with the semiconductor device according to claim 1.

14. An electronic device equipped with the semiconductor device according to claim 2.

15. A method for manufacturing a semiconductor device, comprising:
a semiconductor device formation step, the semiconductor device comprising a first electrode, an oxide semiconductor layer overlapping with the first electrode, a second electrode overlapping with the oxide semiconductor layer, an insulating layer between the first electrode and the oxide semiconductor layer, a charge trap layer between the oxide semiconductor layer and the second electrode, and a third electrode electrically connected to the oxide semiconductor layer, and
a semiconductor device threshold adjustment step comprising trapping charges in the charge trap layer,
wherein the trapping charges in the charge trap layer is performed by keeping the second electrode at a potential higher than a potential of the third electrode for 1 second or more.

16. The method for manufacturing a semiconductor device according to claim 15,
wherein the charge trap layer is negatively charged by the semiconductor device threshold adjustment step.

17. The method for manufacturing a semiconductor device according to claim 15,
wherein the semiconductor device is at a temperature higher than or equal to 125° C. and lower than or equal to 450° C. during the semiconductor device threshold adjustment step.

18. The method for manufacturing a semiconductor device according to claim 15, the method further comprising:
a step of removing the second electrode from the semiconductor device after the semiconductor device threshold adjustment step.

19. The method for manufacturing a semiconductor device according to claim 15, the method further comprising:
a step of floating the second electrode from the semiconductor device after the semiconductor device threshold adjustment step.

20. The method for manufacturing a semiconductor device according to claim 15, the method further comprising:
a step of connecting the second electrode to a wiring configured to be at a constant potential when the semiconductor device is in use.

21. The method for manufacturing a semiconductor device according to claim 15, the method further comprising:
a step of sealing and packaging the semiconductor device after the semiconductor device threshold adjustment step.

22. The method for manufacturing a semiconductor device according to claim 15,
wherein the charge trap layer includes one of:
a) a charge trap second insulating layer and a charge trap first insulating layer between the charge trap second insulating layer and the oxide semiconductor layer, the charge trap first insulating layer having a wider band gap and a lower electron affinity than the charge trap second insulating layer;
b) a stack comprising, in this order, a charge trap first insulating layer, a charge trap second insulating layer, and a charge trap third insulating layer, the charge trap first insulating layer and the charge trap third insulating layer each having a wider band gap and a lower electron affinity than the charge trap second insulating layer; and
c) a conductive layer included in an insulator.

23. A method for manufacturing a semiconductor device, comprising:
a semiconductor device formation step, the semiconductor device comprising a first electrode, an oxide semiconductor layer overlapping with the first electrode, a second electrode overlapping with the oxide semiconductor layer, an insulating layer between the first electrode and the oxide semiconductor layer, a charge trap layer between the oxide semiconductor layer and the second electrode, and a third electrode electrically connected to the oxide semiconductor layer; and
a semiconductor device threshold adjustment step comprising trapping charges in the charge trap layer; and
a step of removing the second electrode from the semiconductor device after the semiconductor device threshold adjustment step.

24. The method for manufacturing a semiconductor device according to claim 23,
wherein the charge trap layer includes one of:
a) a charge trap second insulating layer and a charge trap first insulating layer between the charge trap second insulating layer and the oxide semiconductor layer, the charge trap first insulating layer having a wider band gap and a lower electron affinity than the charge trap second insulating layer;

b) a stack comprising, in this order: a charge trap first insulating layer, a charge trap second insulating layer, and a charge trap third insulating layer, the charge trap first insulating layer and the charge trap third insulating layer each having a wider band gap and a lower electron affinity than the charge trap second insulating layer; and c) a conductive layer included in an insulator.

* * * * *